(12) United States Patent  
Komine

(10) Patent No.: US 7,808,151 B2  
(45) Date of Patent: Oct. 5, 2010

(54) PIEZOELECTRIC ELEMENT DETECTION METHOD, OSCILLATION DEVICE, AND VIBRATING GYROSCOPE

(75) Inventor: Shinichi Komine, Saitama (JP)

(73) Assignee: Citizen Holdings Co., Ltd., Tokyo (JP)

( * ) Notice: Subject to any disclaimer, the term of this patent is extended or adjusted under 35 U.S.C. 154(b) by 384 days.

(21) Appl. No.: 11/860,769

(22) Filed: Sep. 25, 2007

(65) Prior Publication Data

US 2008/0092675 A1 Apr. 24, 2008

(30) Foreign Application Priority Data

Sep. 27, 2006 (JP) ............... 2006-262913  
Sep. 7, 2007 (JP) ............... 2007-232507

(51) Int. Cl.  
*H01L 41/09* (2006.01)

(52) U.S. Cl. ...................... 310/317; 310/370

(58) Field of Classification Search ........... 310/314, 310/317–321, 323.21, 370  
See application file for complete search history.

(56) References Cited

U.S. PATENT DOCUMENTS 5,757,104 A * 5/1998 Getman et al. ............... 310/317

2004/0250621 A1* 12/2004 Fujimoto et al. ............ 73/504.16  
2007/0152539 A1* 7/2007 Huang et al. ................ 310/318

FOREIGN PATENT DOCUMENTS

JP 2001102870 A 4/2001

* cited by examiner

*Primary Examiner*—Walter Benson  
*Assistant Examiner*—Derek J Rosenau  
(74) *Attorney, Agent, or Firm*—Westerman, Hattori, Daniels & Adrian, LLP

(57) ABSTRACT

The measurement of the characteristic of the piezoelectric element of the oscillation device, particularly, the equivalent serial resistance value can be carried out without using a measurement device connected to the outside. An oscillation device causes oscillation by driving a piezoelectric element by means of an oscillation circuit, the equivalent serial resistance value of the piezoelectric element is determined on the basis of the voltage-current relationship between the output signal of the oscillation circuit of the oscillation device and the drive signal used when the oscillation circuit drives the piezoelectric element. The oscillation device has a piezoelectric element, an oscillation circuit that drives the oscillation of the piezoelectric element through feedback of the drive signal to the drive terminal of the piezoelectric element, and a drive signal switch circuit that controls the external output of the drive signal of the oscillation circuit.

14 Claims, 26 Drawing Sheets

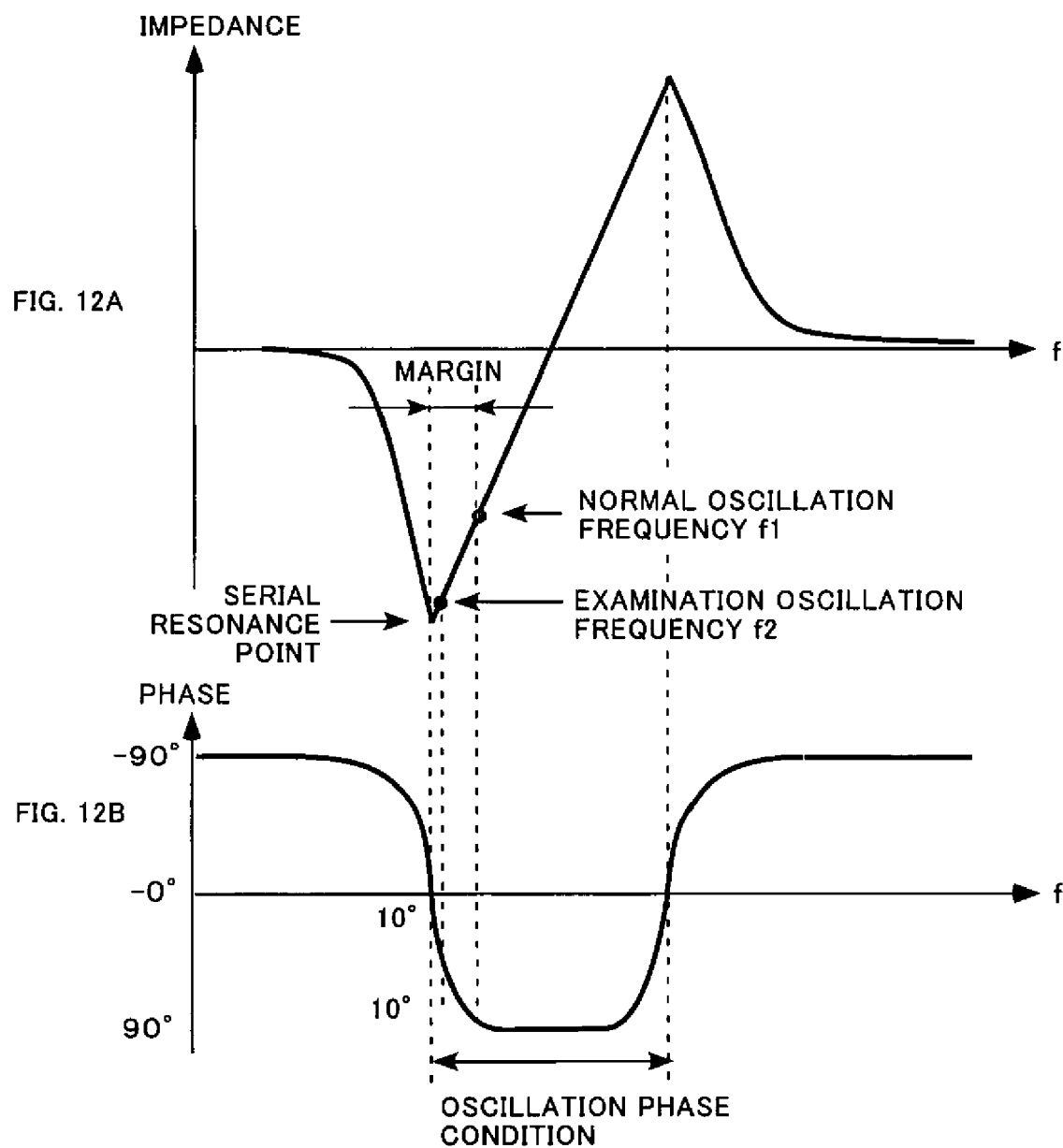

$\beta, \theta_2$

A, $\theta_1$ $A\beta \geq 1$ $\theta_1 + \theta_2 = 2\pi \cdot n$ $\beta, \theta_2 = 80°$ A, $\theta_1 = 280°$ $A\beta \geq 1$ $\theta_1 + \theta_2 = 2\pi \cdot n$ $\beta, \theta_2 = 10°$ A, $\theta_1 = 350°$ $A\beta \geq 1$ $\theta_1 + \theta_2 = 2\pi \cdot n$ NORMAL fc1=1/(2πC1R)
EXAMINATION fc2=1/(2π(C1+C2)R)

FIG. 19A
SUPPLY
FIG. 19B
EXTERNAL
FORCE
(ROTATION)
cw
ccw
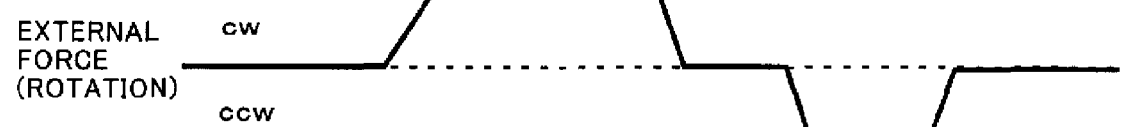
FIG. 19C
SENSOR
OUTPUT
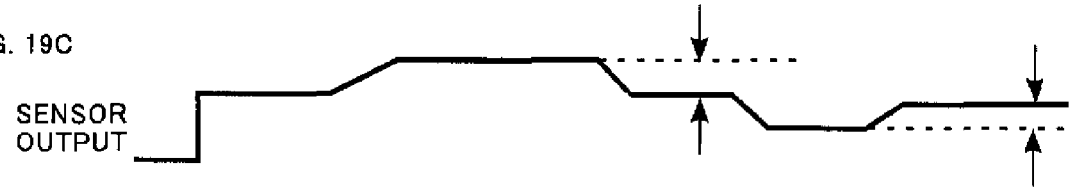

PIEZOELECTRIC ELEMENT DETECTION METHOD, OSCILLATION DEVICE, AND VIBRATING GYROSCOPE

BACKGROUND OF THE INVENTION

1. Field of the Invention

The present invention relates to a method of detecting the characteristics of a piezoelectric element, and more particularly to a method of determining the equivalent serial resistance value of the piezoelectric element, an oscillation device that has a constitution suitable for such characteristic detection, and a vibrating gyroscope that comprises the oscillation device.

2. Description of the Related Art

Oscillation devices that employ a piezoelectric oscillator such as a quartz crystal or the like are used in a wide range of fields such as in various electronic devices such as a clock or reference-frequency frequency source used in the fields of electronics and communication. Examples of electronic devices that comprise such an oscillation device include an angular velocity sensor (gyroscope device), for example. The angular velocity sensor is used in the attitude control and navigation of moving bodies such as vehicles and detects the angular velocity of the moving body by detecting a Coriolis signal that corresponds with the angular velocity.

This oscillation device is miniaturized by integrating a piezoelectric oscillator and an LSI oscillation circuit by incorporating same in a package. Further, in order to increase the accuracy and reliability of the output frequency of the oscillation device, the characteristic of the piezoelectric oscillator which is the oscillating part must be tested and adjusted.

As a characteristic for judging whether or not a piezoelectric oscillator such as a quartz crystal is favorable, a value known as the crystal impedance (CI value) is known. This value is an equivalent constant that corresponds to the serial resistance value R when the piezoelectric element is represented by an equivalent circuit such as the one shown in FIG. 24.

Here, in the equivalent circuit in FIG. 24, the impedance Z is denoted by $Z=1/(j\omega C0)+(1/(R+j(\omega L-1\omega C1)))$. The impedance Z when the oscillation circuit is made to oscillate at a frequency close to the serial resonance frequency ($\omega=1(LC1)^{1/2}$) is $|\omega C0|<<1$ and, therefore, $Z \approx R$. This serial resistance value R is called the crystal impedance (CI value), for example, and is used as the value representing the characteristic of the piezoelectric element.

Generally speaking, in order to determine the serial resistance value of a piezoelectric element that an oscillation device comprises, a constitution in which electrodes that are electrically connected to the piezoelectric element are provided outside the oscillation device is employed. FIG. 25 is an example for connecting a conventional constitution that determines a serial resistance value of the piezoelectric element. FIG. 25A shows an example of a single oscillation device and FIG. 25B shows an example of a gyroscope device that comprises an oscillation device.

In the case of a single oscillation device, as shown in FIG. 25A, an external terminal (Xin terminal) 120 and an external terminal (Xout terminal) 121 are provided in an oscillation circuit 130 that constitutes an oscillation device 101, and an LCR meter 140 is connected to the external terminals (Xin terminals) 120 and 121. The respective equivalent constants of the piezoelectric elements 2 are measured by the LCR meter 140. The oscillation circuit 130 comprises an output terminal 131.

In addition, even in cases where the oscillation device 101 is built into the gyroscope device 110, as shown in FIG. 25B, for the oscillation device 101 that is built into the gyroscope device 110, the LCR meter 140 is connected to the external terminals 120 and 121 as mentioned earlier and the respective equivalent constants of a piezoelectric element 2 are measured by means of the LCR meter 140. A detection circuit 160 comprises an output terminal 161. The oscillation circuit 130 is connected with the oscillation circuit 160 comprising the output terminal 131 through a phase circuit 150.

FIG. 26 shows the relationship between the serial resistance value (CI value) that is actually measured by the LCR meter and the drive voltage (Xout) of the oscillation circuit. Further, here, the drive voltage of the oscillation circuit is for a case where the oscillation circuit performs constant current control. Therefore, it can be seen from FIG. 26 that the voltage characteristic of the output can be judged from the serial resistance value (CI value) and, if the serial resistance value (CI value) is in a predetermined range, the output voltage of the oscillation circuit can be judged to be in the predetermined range.

In addition, Japanese Application Laid Open No. 2001-102870 discloses a constitution that is suitable for testing a crystal oscillator comprising a quartz crystal. According to Japanese Application Laid Open No. 2001-102870, tests on the quartz crystal include a drive level characteristic (DLD characteristic) test that measures the oscillation frequency and the fluctuations corresponding to the quartz crystal loss when the drive level applied to the quartz crystal is changed and the problem that DLD characteristic testing is problematic due to the structure in an oscillator that incorporates a quartz crystal and an oscillation circuit in a package is mentioned.

Methods of solving the above problem include a constitution that provides electrodes that are electrically connected to the electrodes of the quartz crystal outside the oscillator. Japanese Application Laid Open No. 2001-102870 points out the fact that, due to the electrode constitution, there are problems such as the fact that the routing of the wiring is long, there is an invasion of noise into the quartz crystal terminal via the external terminals and, the oscillation operation is unstable and, as a constitution for solving these problems, illustrates a constitution in which, in addition to the bottom face of the package being provided with terminals such as a power source input terminal, a ground terminal, a frequency output terminal, and a control terminal, the bottom face or sides of the package comprise a piezoelectric oscillator testing terminal, the testing terminal being electrically activated when the piezoelectric oscillator is being tested and being electrically de-activated during the oscillation operation.

As mentioned earlier, there is the problem that, in order to determine the characteristics of the piezoelectric element that the oscillation device comprises and, in particular, the equivalent serial resistance value of the piezoelectric element, a measuring device such as an LCR meter must be connected to the outside and a terminal for connecting the measuring device must be provided.

In addition, the piezoelectric element and oscillation circuit that constitute the oscillation device are normally built into a package and an external terminal that is electrically connected to the circuit inside the package must be provided on the outer surface of the package in order to test and adjust the circuit contained in the package. The terminal for performing the testing or adjusting is used in a state where the package alone exists, prior to attaching same to an external device such as a mounting substrate. However, when the package is mounted on an external device after the testing and adjustment are complete, the terminal is then unnecessary because the terminal is not being used. There is also the problem that a potential route for the invasion of external noise is created because the terminal is connected to a circuit inside the package.

Therefore, the ability to measure the characteristic of the piezoelectric element that the oscillation device comprises and, in particular, the equivalent serial resistance value of the piezoelectric element without connecting a measuring device such as an LCR meter to the outside is sought as well as the ability to dispense with the terminal for such measurement.

A terminal for testing and adjusting circuits built into the package that combines a function to establish an electrical connection with a circuit inside the package prior to mounting with a function for preventing the invasion of noise into the circuit in the package in cases where the package is attached to an external device is also sought.

In the aforementioned Japanese Application Laid Open No. 2001-102870, although the testing terminal is electrically de-activated during the oscillation operation, the testing terminal is in an OFF state in an analog switch in the circuit and at an unstable potential in a floating state with respect to the package. It is therefore difficult to completely prevent the invasion of noise.

SUMMARY OF THE INVENTION

Therefore, the present invention solves the conventional problems and an object of the present invention is to perform measurement of the characteristic of the piezoelectric element that the oscillation device comprises and, in particular, of the equivalent serial resistance value without using a measuring device that is connected to the outside. In addition, an object of the present invention is to obviate the need for a terminal for connecting a measuring device.

An object of the present invention is to provide both a function that establishes an electrical connection with a circuit inside the package prior to mounting with a function for preventing the invasion of noise into the circuit in the package in a state where the package is attached to an external device.

The present invention is an oscillation device that causes oscillation by driving a piezoelectric element by means of an oscillation circuit, wherein the characteristic of the piezoelectric element that the oscillation device comprises and, in particular, the equivalent serial resistance value of the piezoelectric element is sought on the basis of the voltage-current relationship between the output signal of the oscillation circuit that the oscillation device comprises and the drive signal used when the oscillation circuit drives the piezoelectric element.

The oscillation circuit outputs an output signal that is set as a result of the control of the oscillation circuit in a normal usage state that exhibits the functions of the oscillation circuit. Thereupon, in a normal operating state, the oscillation circuit does not output the drive signal for driving the piezoelectric element to the outside.

In cases where the equivalent serial resistance value of the piezoelectric element, the oscillation circuit is used to drive the piezoelectric element and outputs the drive signal that is not normal output to the outside and determines the equivalent serial resistance value by using this drive signal. The equivalent serial resistance value of the piezoelectric element is calculated based on the voltage-current relationship between the drive signal and the output signal of the oscillation circuit.

For example, in cases where the oscillation circuit is driven by means of constant current control, the oscillation circuit outputs a current output with a constant current value as a normal output. Here, the voltage of the drive signal that drives the piezoelectric element is subject to control so that the current output is constant.

Therefore, the piezoelectric element has the voltage of the drive signal applied thereto and a constant current that is the same as the current output flows thereto. The voltage-current relationship between the drive signal and the output signal of the oscillation circuit depends on the impedance of the piezoelectric element. Thereupon, if the frequency of the drive signal is a frequency close to the serial resonance frequency, because the impedance of the piezoelectric element is substantially the equivalent serial resistance value of the piezoelectric element, the equivalent serial resistance value of the piezoelectric element can be calculated from a voltage-current relationship between the drive signal and the output signal of the oscillation circuit thus determined.

However, in cases where the oscillation circuit is driven by constant current control, the oscillation circuit outputs a voltage output with a constant voltage value as a normal output. Thereupon, the current of the drive signal that drives the piezoelectric element is subject to control so that the voltage output is constant.

Therefore, the current of the drive signal flows to the piezoelectric element and a constant voltage output is applied to the piezoelectric element. The voltage-current relationship between the drive signal and the output signal of the oscillation circuit depends on the impedance of the piezoelectric element as per the constant current control. Here, if the frequency of the drive signal is a frequency close to the serial resonance frequency, the impedance of the piezoelectric element is the equivalent serial resistance value of the piezoelectric element and, therefore, the equivalent serial resistance value of the piezoelectric element can be calculated from the voltage-current relationship between the drive signal and the output signal of the oscillation circuit thus determined.

The oscillation circuit normally does not output the drive signal to the outside, outputting only the output signal. Therefore, the present invention outputs a drive signal to the outside via the switch circuit in order to calculate the equivalent serial resistance value of the piezoelectric element.

The output signal of the oscillation circuit may also be determined by measuring the output signal of the oscillation circuit in addition to using a scalar value that is set for the oscillation circuit.

The present invention makes it possible to extract a drive signal that is not normally output to the outside simply by means of ON/OFF control of the switch circuit and calculate the equivalent serial resistance value of the piezoelectric element from the voltage-current relationship between this drive signal and the output signal. The equivalent serial resistance value of the piezoelectric element can be determined without using an external measurement device such as an LCR meter.

In addition, in cases where measurement of the equivalent serial resistance value of the piezoelectric element is performed using an external measurement device such as an LCR meter, because the signal obtained by sweeping the frequencies of the output signal before and after the serial resonance frequency with a reference signal, there is the problem that the measurement time is long. However, the present invention is able to resolve the above problem and shorten the measurement time.

The present invention can have a plurality of aspects such as an aspect of a piezoelectric element detection method, an aspect of an oscillation device that is able to perform this piezoelectric element detection, and an aspect of a gyroscope device that comprises the oscillation device.

The aspect of the piezoelectric element detection method of the present invention connects a switch circuit to a closed circuit that is formed by the piezoelectric element and the oscillation circuit, outputs a drive signal for driving the oscillation circuit to the outside via the switch circuit, and determines the equivalent serial resistance value of the piezoelectric element from the voltage-current relationship between the output signal of the oscillation circuit and the drive signal.

In the aspect of the method of detecting the piezoelectric element of the present invention, during the constant voltage control of the piezoelectric element, the voltage value of the output voltage during measurement of the equivalent serial resistance value of the piezoelectric element is adjusted smaller than the voltage value of the output voltage during the oscillation operation of the piezoelectric element. Furthermore, during the constant current control of the piezoelectric element, the current value of the output current during measurement of the equivalent serial resistance value of the piezoelectric element is adjusted smaller than the current value of the output current during oscillation of the piezoelectric element.

The output current or output voltage output by the oscillation circuit rises at predetermined time constant that is determined from the Q value of the piezoelectric element or the like after the oscillation is started up. For this reason, the startup time required to reach a predetermined output current or output voltage after the oscillation is started up grows shorter the smaller the targeted predetermined output current value or predetermined output voltage value is. In the aspect of the piezoelectric element detection method of the present invention, by making the value of the output current or output voltage during measurement a value that is smaller than the value of the output current or output voltage during normal oscillation that is used for the oscillation device, the startup time required to measure the equivalent serial resistance value of the piezoelectric element after the oscillation is started can be shortened and the measurement time can be shortened.

In addition, in the aspect of the piezoelectric element detection method of the present invention, during measurement of the equivalent serial resistance value of the piezoelectric element, the oscillation frequency of the piezoelectric element can be set at a value that is closer to a serial resonance frequency of the piezoelectric element than the oscillation frequency during the oscillation operation of the piezoelectric element.

In cases where the driven element of the piezoelectric element in the oscillation device is driven to oscillate, the frequency at which the piezoelectric element is made to oscillate is not the serial resonance frequency of the piezoelectric element and is set at a frequency that is separated by a margin from the serial resonance frequency in the frequency range that satisfies the phase condition of the oscillation conditions. This is so that, even in cases where the frequency characteristic of the oscillation circuit varies as a result of environmental changes such as temperature, a situation where the oscillation frequency does not satisfy the phase condition constituting the oscillation condition and where oscillation is impossible is avoided.

In the measurement of the equivalent serial resistance value of the piezoelectric element, the measurement error of the equivalent serial resistance value of the piezoelectric element that is obtained in this measurement grows smaller and the measurement accuracy of the CI value determined from the serial resistance value rises the closer the value is to the serial resonance frequency of the piezoelectric element. In the aspect of the piezoelectric element detection method of the present invention, because, during measurement, the temperature is constant in comparison with during an oscillation operation, there is little hindrance to measurement even when environmental conditions such as the temperature are made more lenient than during the oscillation operation. Therefore, in the aspect of the piezoelectric element detection method of the present invention, during measurement of the equivalent serial resistance value of the piezoelectric element, the value of the equivalent serial resistance value is set at a value closer to a serial resonance frequency of the piezoelectric element than the oscillation frequency that drives the oscillation of the piezoelectric element in the oscillation device, whereby a more accurate measurement accuracy can accordingly be obtained.

The aspect of the oscillation device of the present invention comprises a piezoelectric element, an oscillation circuit that drives the oscillation of the piezoelectric element through feedback of a drive signal to a drive terminal of the piezoelectric element, and a drive signal switch circuit that controls the external output of the drive signal of the oscillation circuit.

The oscillation circuit performs constant voltage control or constant current control of the piezoelectric element and the drive signal switch circuit outputs the drive current or drive voltage of the drive signal of the oscillation circuit as a signal for calculating the equivalent serial resistance value of the piezoelectric element.

Here, the oscillation device oscillates at a frequency that is determined by the piezoelectric element and oscillation circuit and outputs the frequency signal as an output signal. In cases where the oscillation circuit is driven by the constant current control, the signal current of the output signal is controlled to a constant current value and is applied to the gyroscope device, for example. In addition, in cases where the oscillation circuit is driven by the constant voltage control, the signal current of the output signal is controlled to a constant voltage value.

In the case of the oscillation circuit of the present invention, the drive signal switch circuit is constituted comprising a first switch circuit that controls the electrical connection between the oscillation circuit and the detection terminal and a second switch circuit that controls the electrical connection between the standing potential and the detection terminal, and the first and second switch circuits are made to operate exclusively.

In this constitution, the first switch circuit is set to the ON state and the second switch circuit to the OFF state during measurement. In the switch state of the drive signal switch circuit, the oscillation circuit is electrically connected to the detection terminal. As a result of this connection, the detection terminal is able to detect the drive current from the closed circuit of the oscillation circuit.

However, during a normal oscillation operation, the first switch circuit is set to the OFF state and the second switch circuit is set to the ON state. In the switch state of the drive signal switch circuit, the oscillation circuit is in an isolated state as a result of being electrically separated from the detection terminal and the detection terminal is connected to a standing potential such as ground. As a result, the detection terminal of the package of the oscillation device can be fixed at a standing potential and the invasion of noise into the oscillation device from the outside can be prevented due to the shielding effect of the package.

In addition, the vibrating gyroscope of the present invention comprises the oscillation device of the present invention and comprises a piezoelectric element serving as a driven element and a detection element; an oscillation circuit that drives the oscillation of the piezoelectric element through feedback of a drive signal to a drive terminal of the piezoelectric element serving as the driven element; a detection circuit that detects an output that is output by a detection terminal of the piezoelectric element serving as the detection element and outputs a detection signal; a drive signal switch circuit that controls the external output of the drive signal of the oscillation circuit; and a detection signal switch circuit that controls the external output of the detection signal of the detection circuit.

The gyroscope device drives the driven element of the piezoelectric element by means of the drive signal, causing same to vibrate at a predetermined frequency, changes the vibration state of the detection element of the piezoelectric element by means of a Coriolis force that arises as a result of the force applied from the outside, and determines the force applied by using a detection circuit to detect the output signal that depends on the vibration state.

The gyroscope device outputs the detection signal of the detection circuit to the outside in a normal operating state and does not output the drive signal of the oscillation circuit to the outside. However, in an examination state where the equivalent serial resistance value of the piezoelectric element is determined, the gyroscope device outputs the drive signal of the oscillation circuit to the outside but does not output the detection signal of the detection circuit to the outside.

The output switching of the drive signal and detection signal to the outside can be carried out by the switching of the drive signal switch circuit and the detection signal switch circuit.

The drive signal switch circuit and detection signal switch circuit are controlled exclusively in conjunction with one another and, by outputting either one of the drive signal of the oscillation circuit and the detection signal of the detection circuit to the outside, the drive signal of the oscillation circuit and detection signal of the detection circuit can be selectively output from one output terminal.

The oscillation circuit performs constant voltage control or constant current control of the piezoelectric element and, through the switching of the drive signal switch circuit, outputs the drive current or drive voltage of the drive signal of the oscillation circuit to the outside as a signal for calculating the equivalent serial resistance value.

In addition, the gyroscope device is able to adjust the output level of the detection signal output by the detection circuit and a constitution that adjusts the output level comprises a control circuit that controls an amplification factor of an amplifier circuit of the detection circuit and a storage circuit that stores correction data for adjusting the amplification factor of the amplifier circuit. The control circuit reads correction data from the storage circuit during adjustment and adjusts the amplification factor on the basis of the correction data thus read.

Here, the storage circuit stores control data for exclusively driving the drive signal switch circuit and detection signal switch circuit in addition to the correction data for adjusting the output level. The control circuit reads the control data from the storage circuit and outputs either one of the drive signal of the oscillation circuit and the detection signal of the detection circuit to the outside by means of exclusive driving that turns ON one of the drive signal switch circuit and the detection signal switch circuit and turns OFF the other on the basis of the control data.

In addition, the storage of the control data by the storage circuit is able to employ an excess bit of the correction data for adjusting the amplification factor of the amplifier circuit. The state ("0" or "1") of the data of the excess bit and the ON state and OFF state of the drive signal switch circuit and detection signal switch circuit are stored in association with one another.

In creating a constitution in which control of the drive signal switch circuit and detection signal switch circuit by using the excess bit of the correction data, the control circuit and storage circuit for adjusting the output level of the detection signal of the gyroscope device can be utilized, whereby the need for a special circuit constitution can be obviated.

In addition, a constitutional example of the oscillation circuit comprises a current/voltage conversion circuit that converts the output current that is output by the piezoelectric element as the driven element into an AC voltage, a variable gain amplifier that amplifies an AC signal from the current/voltage conversion circuit and is able to vary an amplification factor, a rectification circuit that rectifies the output voltage from the current/voltage conversion circuit or the drive voltage applied to the piezoelectric element; and a comparison circuit that compares the output signal output from the rectification circuit and a predetermined reference signal and outputs a control voltage in accordance with fluctuations in the signal output from the rectification circuit. Further, the variable gain amplifier controls the amplification factor on the basis of the control voltage and maintains the output current from the piezoelectric element or the drive voltage applied to the piezoelectric element at a constant level.

The drive signal switch circuit and detection signal switch circuit may also be constituted by a CMOS transistor.

According to the present invention, the measurement of the characteristic of the piezoelectric element that the oscillation device comprises and the equivalent serial resistance value can be carried out without using a measurement device that is connected to the outside. In addition, the time taken to measure the equivalent serial resistance value can be shortened.

A terminal for connecting the measurement device can be dispensed with.

In addition, the gyroscope device or the like can be provided with a function for an electrical connection to a circuit in the package prior to mounting and a function for preventing the invasion of noise into the circuit in the package in a state where the package is attached to an external device.

BRIEF DESCRIPTION OF THE DRAWINGS

FIG. 12 serves to illustrate the frequency characteristic of the phase and impedance of the piezoelectric element of the present invention;

FIG. 19 serves to illustrate the signal relationships in the sensitivity measurement of the present invention;

DESCRIPTION OF THE PREFERRED EMBODIMENTS

The respective aspects of a method of detecting the piezoelectric element of the present invention, an aspect of an oscillation device that is capable of detecting the piezoelectric element, and an aspect of a gyroscope device that comprises the oscillation device will be described hereinbelow in detail using the drawings.

Figure 1A:
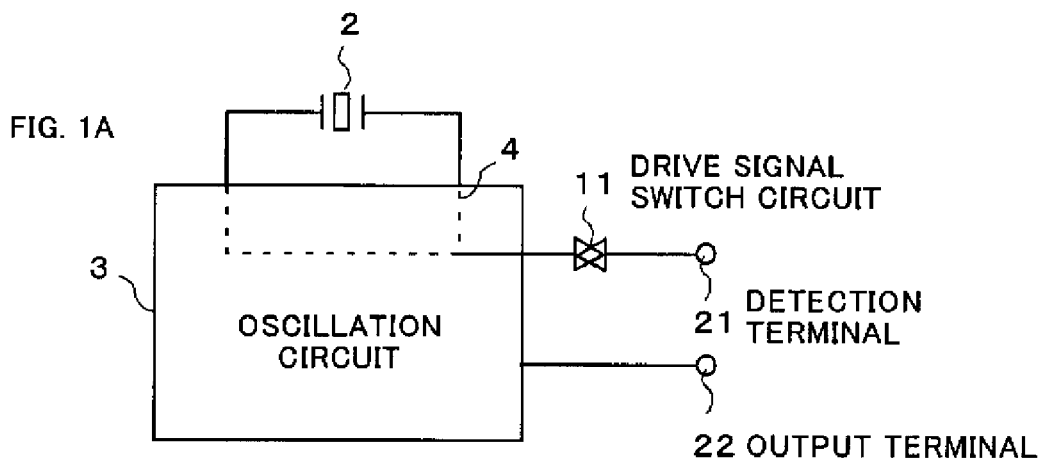
FIG. 1 serves to illustrate the overall constitution of an aspect of an oscillation device that performs measurement of an equivalent serial resistance value for a piezoelectric element of the present invention.
Figure 1B:
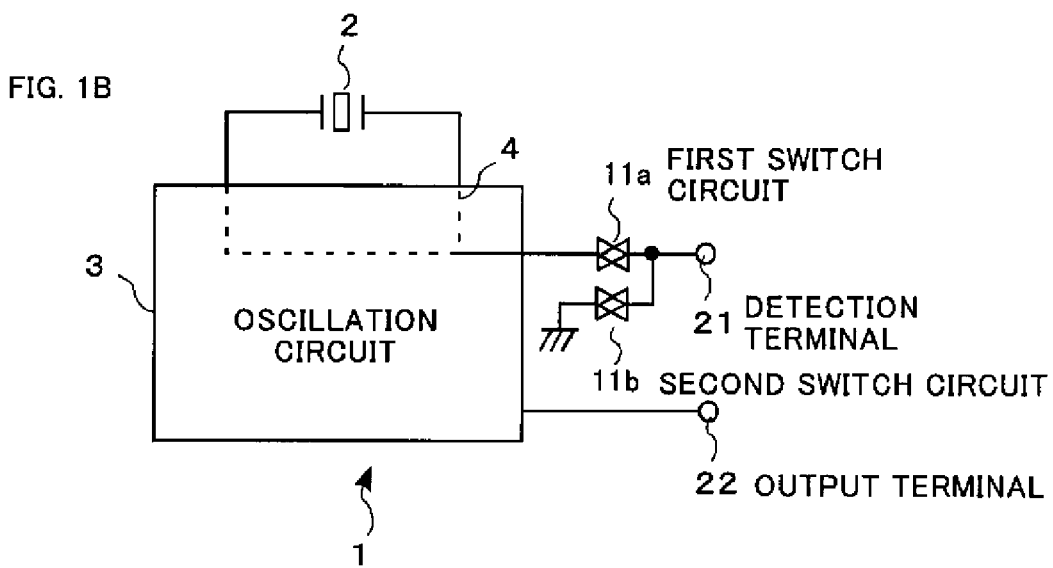
Figure 1C:
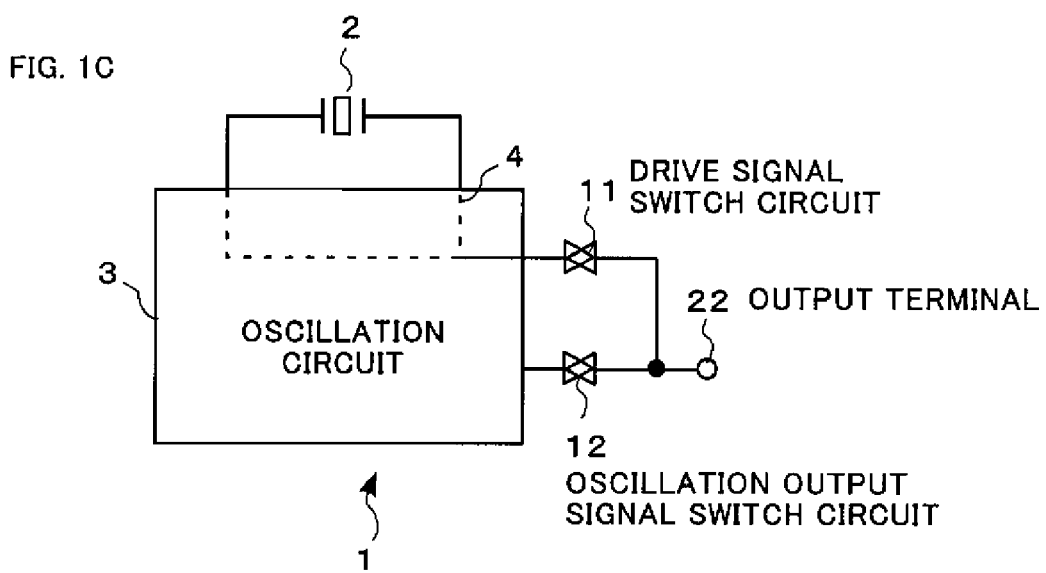

FIG. 1 serves to illustrate the overall constitution of an aspect of the oscillation device that measures the equivalent serial resistance value of the piezoelectric element of the present invention. Here, three forms of the oscillation device will be described. FIG. 1A is a schematic constitutional view serving to illustrate a first form of the oscillation device; FIG. 1B is a schematic constitutional view serving to illustrate a second form of the oscillation device, and FIG. 1C is a schematic constitutional view serving to illustrate a third form of the oscillation device.

The first form of the oscillation device is a constitution which, as shown in FIG. 1A, comprises an output terminal 22 for outputting the oscillation signal of the oscillation circuit to the outside when the oscillation device 1 is in a normal operating state and, separately from the output terminal 22, a detection terminal 21 for outputting the drive signal of the oscillation circuit to the outside in a state where the oscillation device 1 is in an examination operating state.

In this constitution, the oscillation device 1 causes the piezoelectric element 2 to oscillate at a predetermined frequency by making the piezoelectric element 2 a driven element and connecting an oscillation circuit 3 that drives the piezoelectric element 2 to both terminals of the piezoelectric element 2. Here, the piezoelectric element 2 and oscillation circuit 3 form a closed circuit 4 and a drive signal switch circuit 11 is connected between the closed circuit 4 and the detection terminal 21. The detection terminal 21 is a terminal for outputting the drive signal of the oscillation circuit 3 that flows to the closed circuit 4 to the outside. An output terminal 22 for outputting the output signal of the oscillation circuit 3 to the outside is provided.

The oscillation device 1 outputs the output signal of the oscillation circuit 3 to the outside from the output terminal 22 in a normal drive state. Thereupon, by setting the drive signal switch circuit 11 to the OFF state, the closed circuit 4 of the oscillation circuit 3 assumes a state of being electrically isolated from the detection terminal 21 such that the oscillation circuit 3 does not output a drive signal for driving the piezoelectric element 2 to the outside.

Meanwhile, the oscillation device 1 outputs the output signal of the oscillation circuit 3 to the outside via the output terminal 22 in a piezoelectric element detection state and, as a result of the drive signal switch circuit 11 assuming an ON state, the closed circuit 4 of the oscillation circuit 3 is electrically connected to the detection terminal 21 and the oscillation circuit 3 outputs a drive signal for driving the piezoelectric element 2 to the outside.

Therefore, in the first form of the oscillation device, the output signal of the oscillation circuit 3 is continuously output from the output terminal 22 in both the normal drive state and also the piezoelectric element examination state and the drive signal for driving the piezoelectric element 2 is output from the detection terminal 21 only in the piezoelectric element detection state.

The second form of the oscillation device is constituted by a first switch circuit 11a and a second switch circuit 11b that exclusively operate the drive signal switch circuit 11 as shown in FIG. 1B. The first switch circuit 11a controls the open and closed state between the detection terminal 21 and the closed circuit 4 of the oscillation circuit 3 and the second switch circuit 11b controls the open and closed state between the detection terminal 21 and a standing potential such as ground potential. The first switch circuit 11a and second switch circuit 11b operate exclusively, with the second switch circuit 11b in the OFF state when the first switch circuit 11a is in the ON state and, conversely, the second switch circuit 11b in the ON state when the first switch circuit 11a is in the OFF state.

In cases where the first switch circuit 11a is in the ON state and the second switch circuit 11b is in the OFF state, the closed circuit 4 of the oscillation circuit 3 is electrically connected to the detection terminal 21 and the drive current of the closed circuit 4 can be detected by the detection terminal 2. However, in cases where the first switch circuit 11a is in the OFF state and the second switch circuit 11b is in the ON state, the closed circuit 4 of the oscillation circuit 3 is electrically isolated from the detection terminal 21 and the detection terminal 21 is maintained at a standing potential such as the ground potential. The detection terminal 21 is normally provided in the package of the oscillation device. By placing the detection terminal 21 at a standing potential, the package is able to prevent the invasion of noise from the outside inside the oscillation device as a result of the shielding effect. The release of the noise component from within the oscillation circuit to the outside can also be prevented.

The operation of the detection terminal 21 and output terminal 22 can be made the same as that of the first form shown in FIG. 1A.

The third form of the oscillation device is such that, as shown in FIG. 1C, the oscillation device 1 comprises the output terminal 22 for outputting the output signal of the oscillation circuit 3 to the outside in a normal operating state and the output terminal 22 has a constitution that is also employed as a terminal for outputting the drive signal of the oscillation circuit 3 to the outside in a state where the oscillation device 1 is in the examination operating state.

In this constitution, the oscillation device 1 causes the piezoelectric element 2 to oscillate at a predetermined frequency by making the piezoelectric element 2 a driven element and connecting an oscillation circuit 3 that drives the piezoelectric element 2 to both terminals of the piezoelectric element 2. Here, the piezoelectric element 2 and oscillation circuit 3 form a closed circuit 4 and a drive signal switch circuit 11 is connected between the closed circuit 4 and the output terminal 22. Further, an oscillation output signal switch circuit 12 is connected between a node that outputs the output signal of the oscillation circuit 3 and the output terminal 22. Therefore, the output terminal 22 also serves as a terminal for outputting, to the outside, the drive signal of the oscillation circuit 3 that flows to the closed circuit 4 as a result of the ON operation of the drive signal switch circuit 11.

The oscillation device 1 outputs the output signal of the oscillation circuit 3 to the outside from the output terminal 22 as a result of turning ON the oscillation output signal switch circuit 12 in a normal drive state. Thereupon, as a result of turning OFF the drive signal switch circuit 11, the drive signal with which the oscillation circuit 3 drives the piezoelectric element 2 is not output to the outside.

However, as a result of the drive signal switch circuit 11 being ON and the oscillation output signal switch circuit 12 being OFF in the piezoelectric element detection state, the oscillation device 1 does not output the output signal of the oscillation circuit 3 from the output terminal 22 to the outside, and the drive signal that allows the oscillation circuit 3 to drive the piezoelectric element 2 is output to the outside.

Therefore, in the third form of the oscillation device, the drive signal switch circuit 11 and oscillation output signal switch circuit 12 are made to operate exclusively and, as a result of only either one of the switch circuits being ON while the other switch circuit is OFF, in the normal drive state, the output signal of the oscillation circuit 3 is output from the output terminal 22 and, in the piezoelectric element examination state, a drive signal for driving the piezoelectric element 2 is output by the output terminal 22.

FIG. 2 serves to illustrate the signal form of the output signal of the oscillation device. Here, as the piezoelectric element 2, an example of a tuning fork-type piezoelectric element that has two legs 2a and 2b is shown.

Figure 2A:
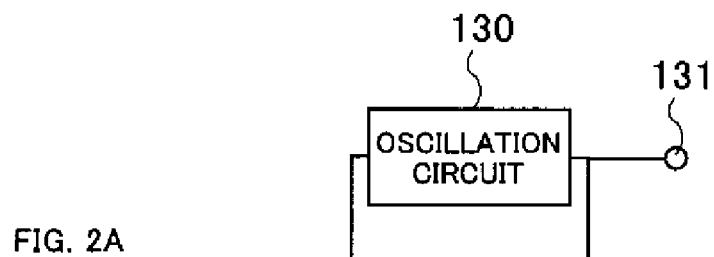
FIG. 2 serves to illustrate a signal form of the output signal of the oscillation device of the present invention.

In the form shown in FIG. 2A, the frequency signal produced by the oscillation of the oscillation device 1 can be adopted as the output signal and applied to a frequency signal output device that outputs a predetermined frequency signal. The legs 2a and 2b that the tuning fork-type piezoelectric element 2 comprises are provided with a drive electrode and the drive electrode is driven by a drive signal that is supplied by the oscillation circuit 130 such that oscillation takes place at a predetermined frequency. The oscillation device 1 outputs a frequency signal of the oscillation frequency from the output terminal 131 as an output signal.

Figure 2B:
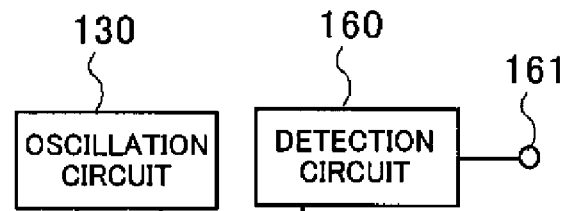

Meanwhile, the form shown in FIG. 2B is such that the frequency signal of the detection leg that the oscillation device 1 comprises is the output signal and can be applied to a gyroscope device, for example.

The legs 2a and 2b that the tuning fork-type piezoelectric element 2 comprises are provided with a drive electrode and a detection electrode and the drive electrode drives the drive leg after being supplied with the drive signal supplied by the oscillation circuit 130. The oscillation circuit 130 oscillates at a predetermined frequency.

The detection leg drives oscillates together with the oscillation of the drive leg such that an oscillation component in a direction that differs from the oscillation of the drive leg is produced as a result of the Coriolis force that arises as a result of the force applied by an externally applied force such as the angular velocity. The detection circuit 160 captures the frequency signal containing the oscillation component from the detection electrode and outputs a detection signal from the detection terminal 161. The drive leg and detection leg can be combined in FIG. 2B.

Figure 3:
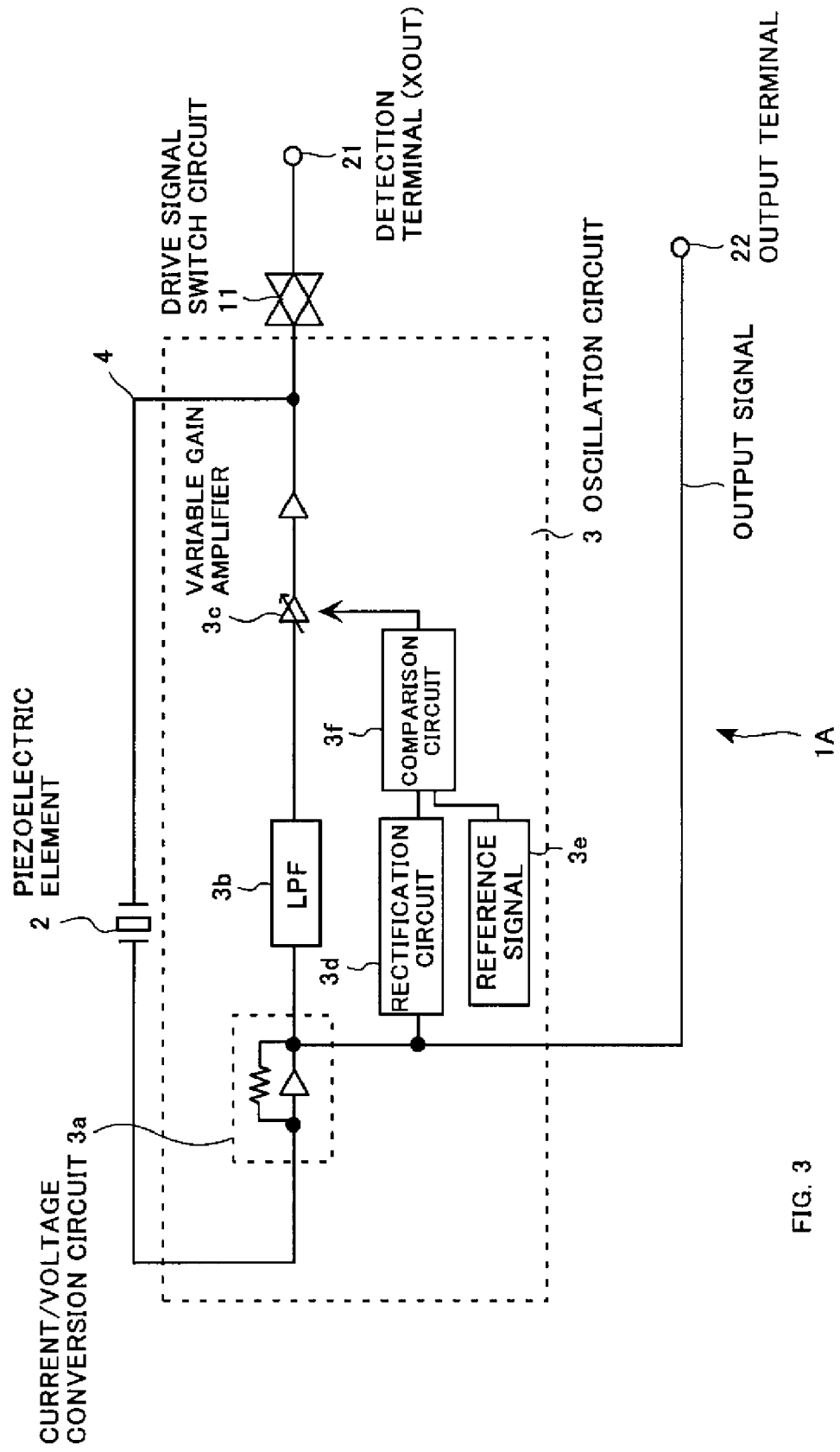
FIG. 3 shows a constitutional example of an oscillation device in which the oscillation circuit of the present invention performs constant current control.
Figure 4:
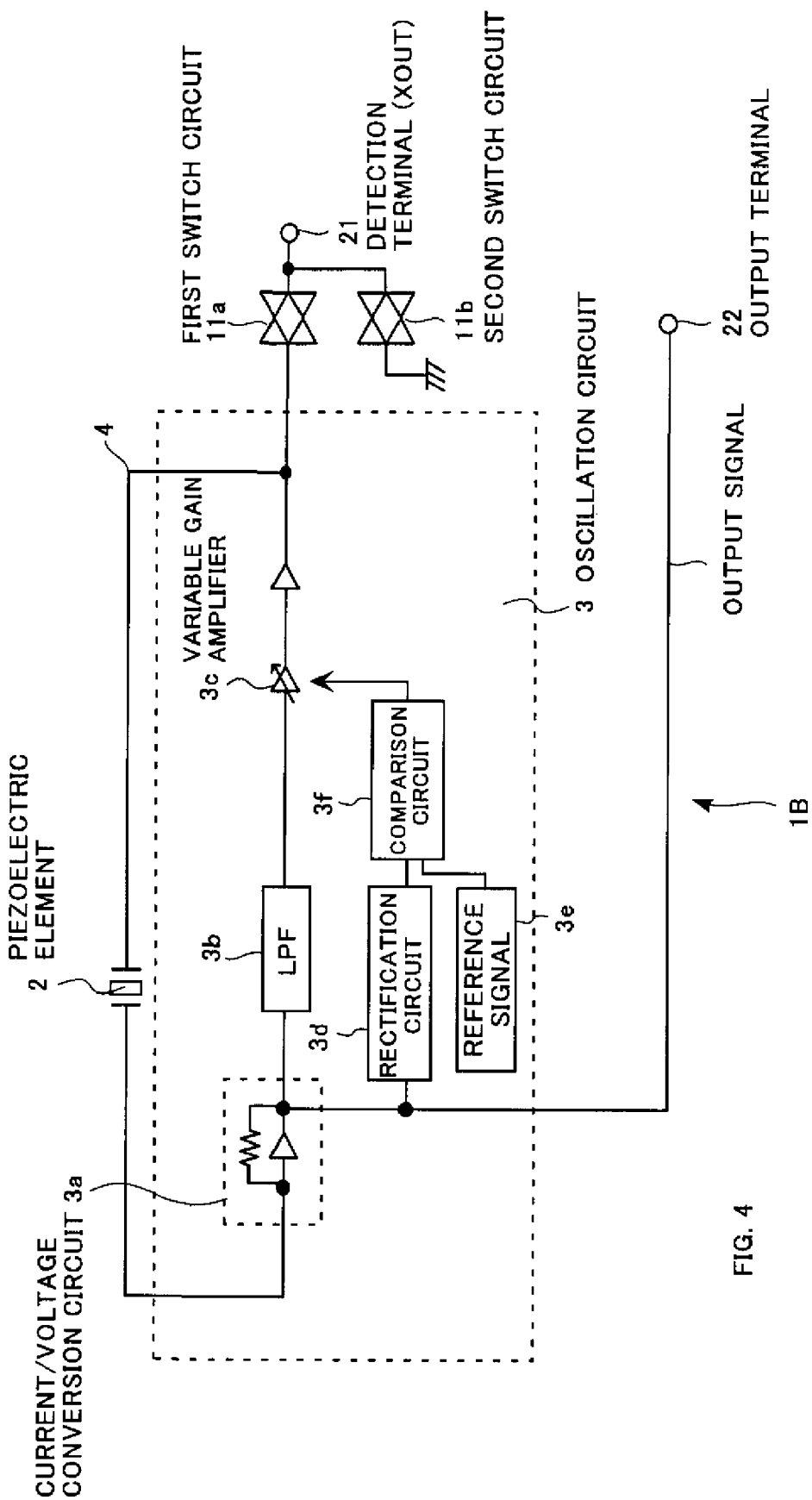
FIG. 4 shows a constitutional example of an oscillation device in which the oscillation circuit of the present invention performs constant current control.
Figure 5:
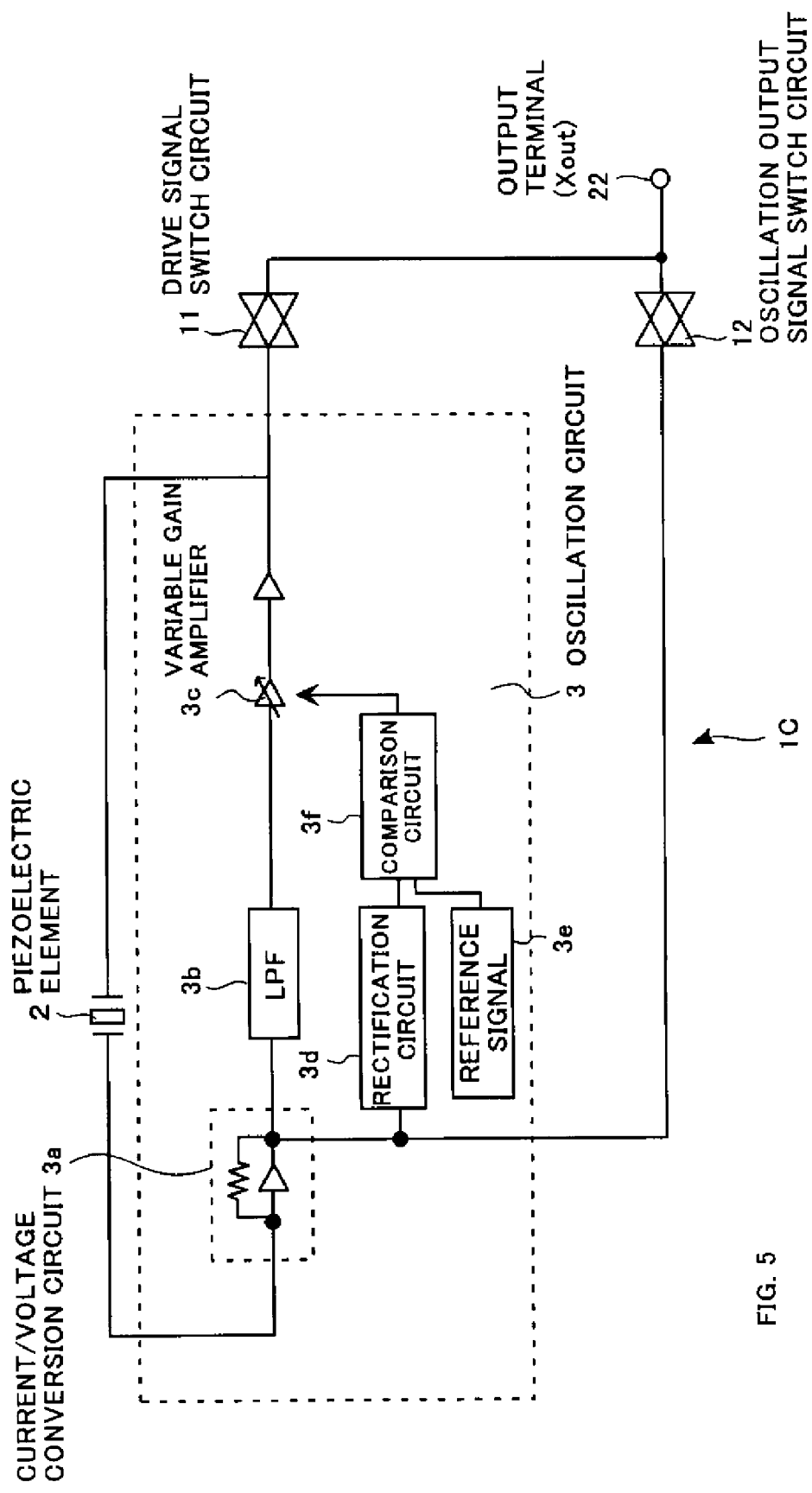
FIG. 5 shows a constitutional example of an oscillation device in which the oscillation circuit of the present invention performs constant current control.
Figure 6:
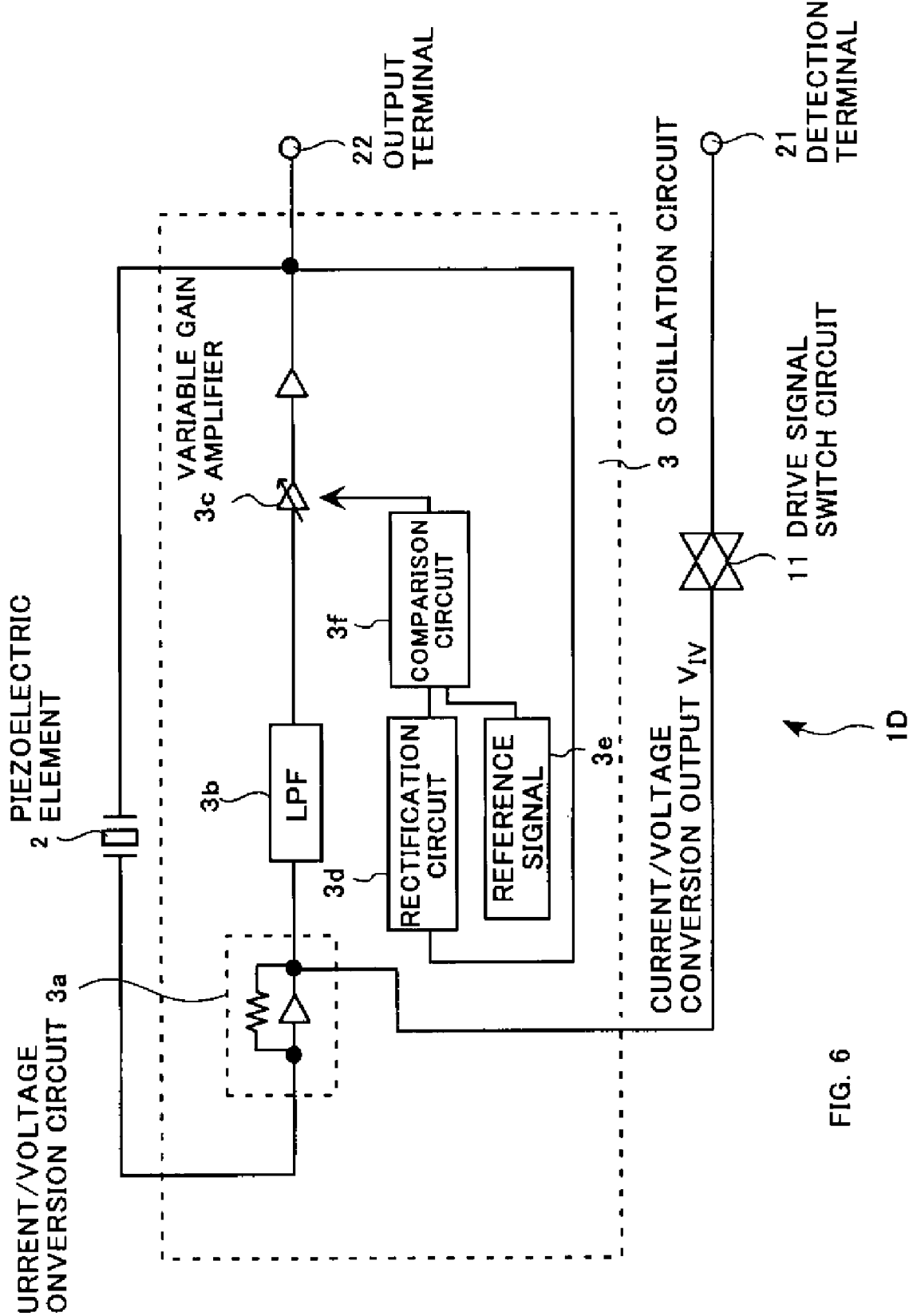
FIG. 6 shows a constitutional example of an oscillation device in which the oscillation circuit of the present invention performs constant voltage control.
Figure 7:
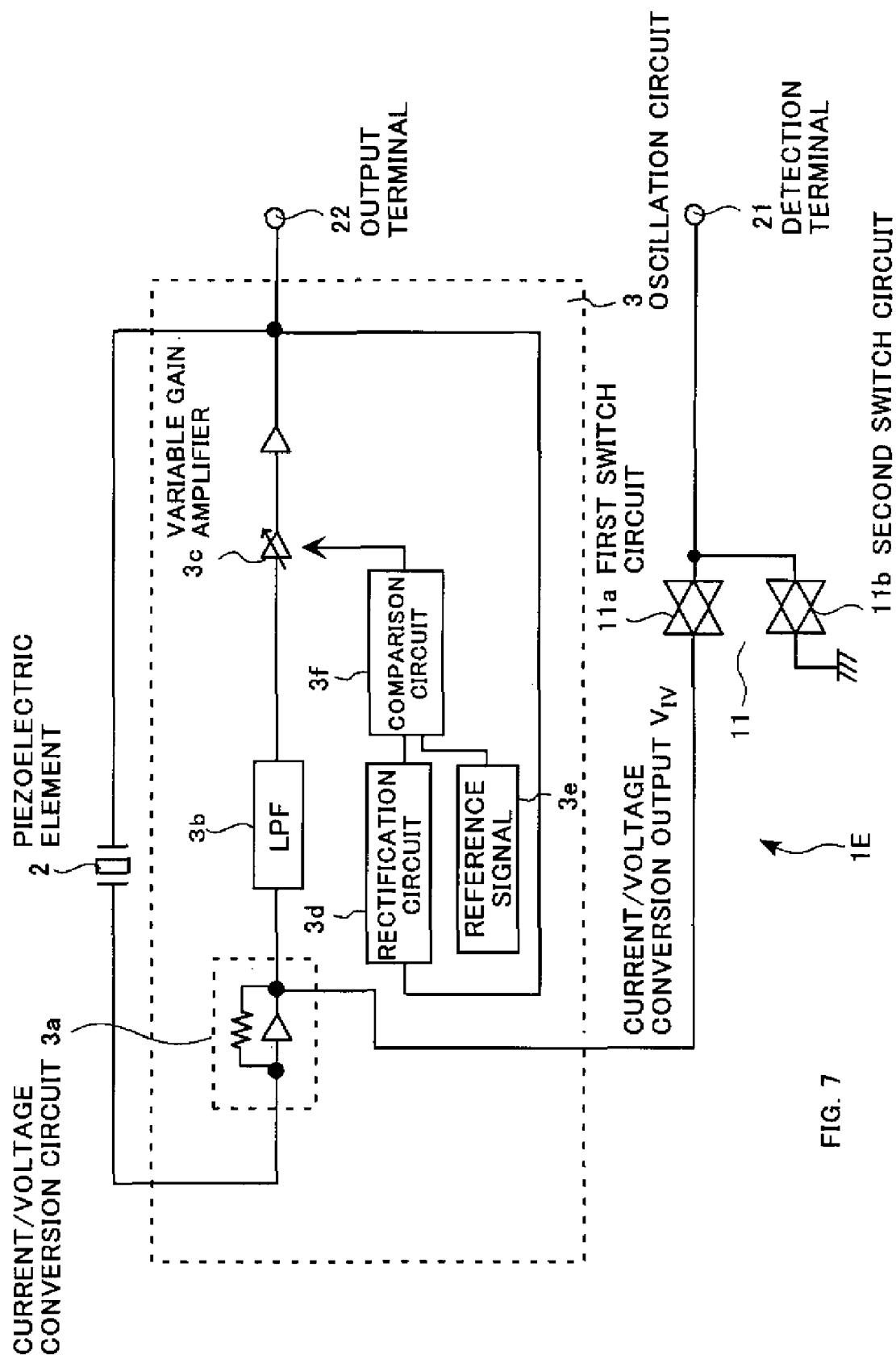
FIG. 7 shows a constitutional example of an oscillation device in which the oscillation circuit of the present invention performs constant voltage control.
Figure 8:
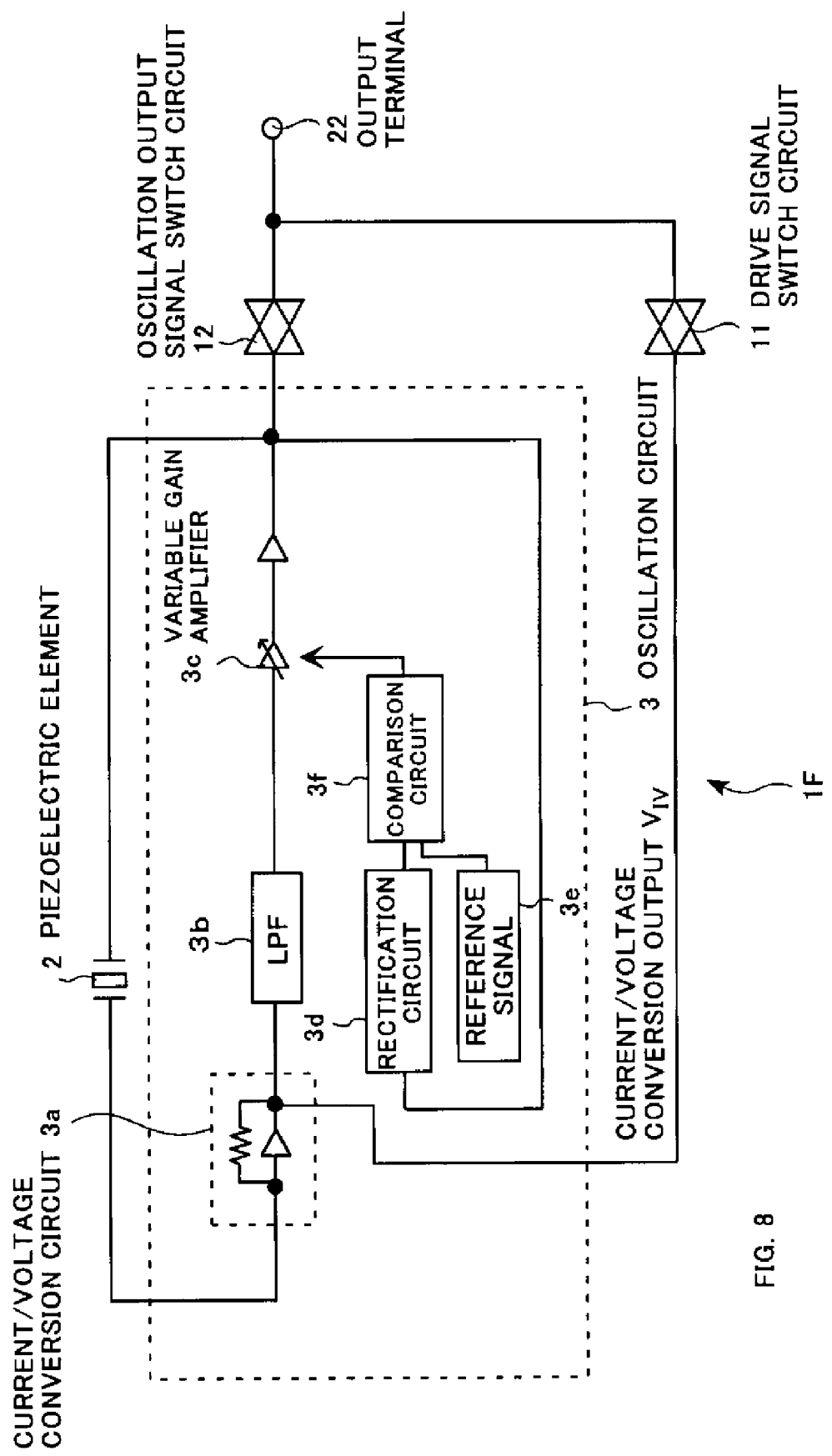
FIG. 8 shows a constitutional example of an oscillation device in which the oscillation circuit of the present invention performs constant voltage control.
Figure 9:
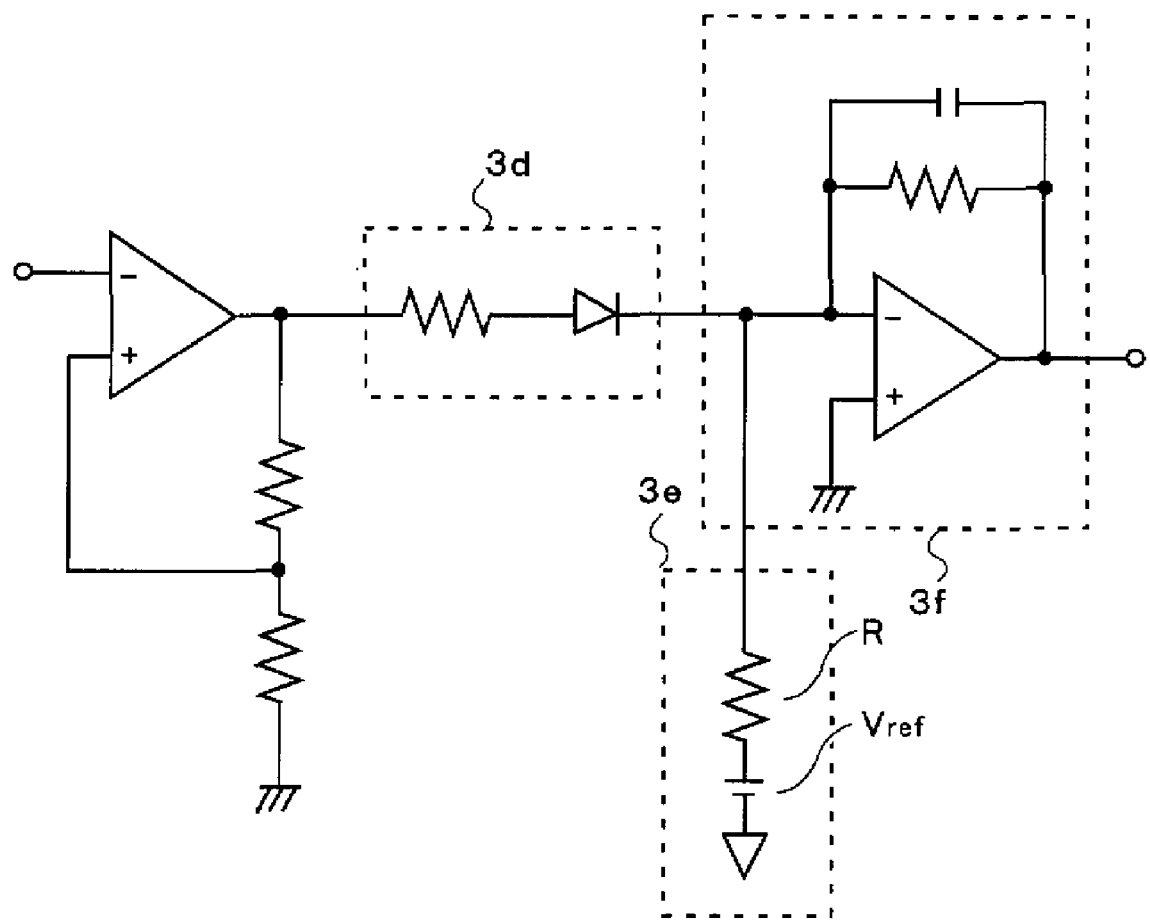
FIG. 9 shows a constitutional example of an automatic gain control circuit of the present invention.
Figure 10:
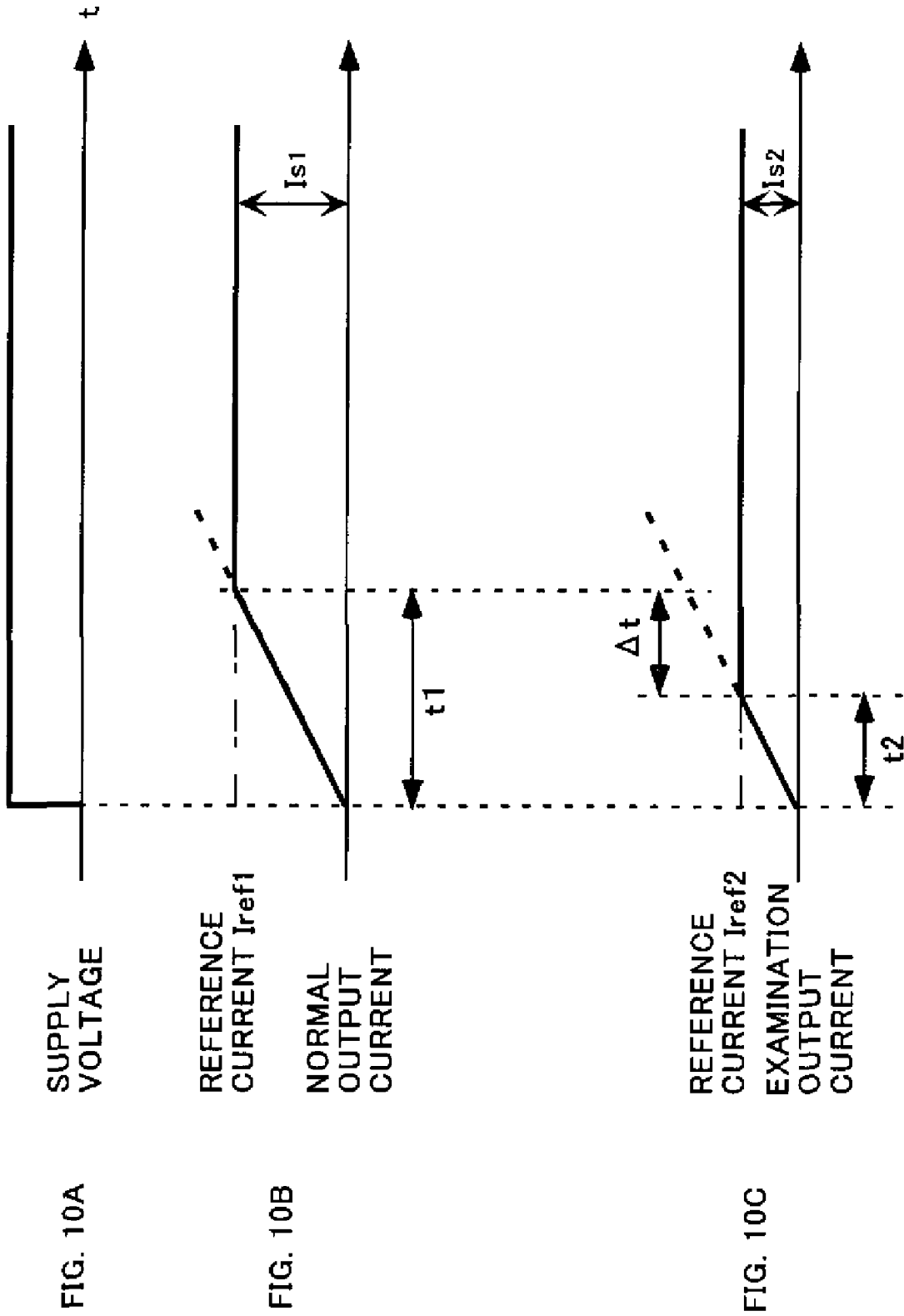
FIG. 10 shows a signal diagram for the automatic gain control circuit of the present invention.
Figure 11:
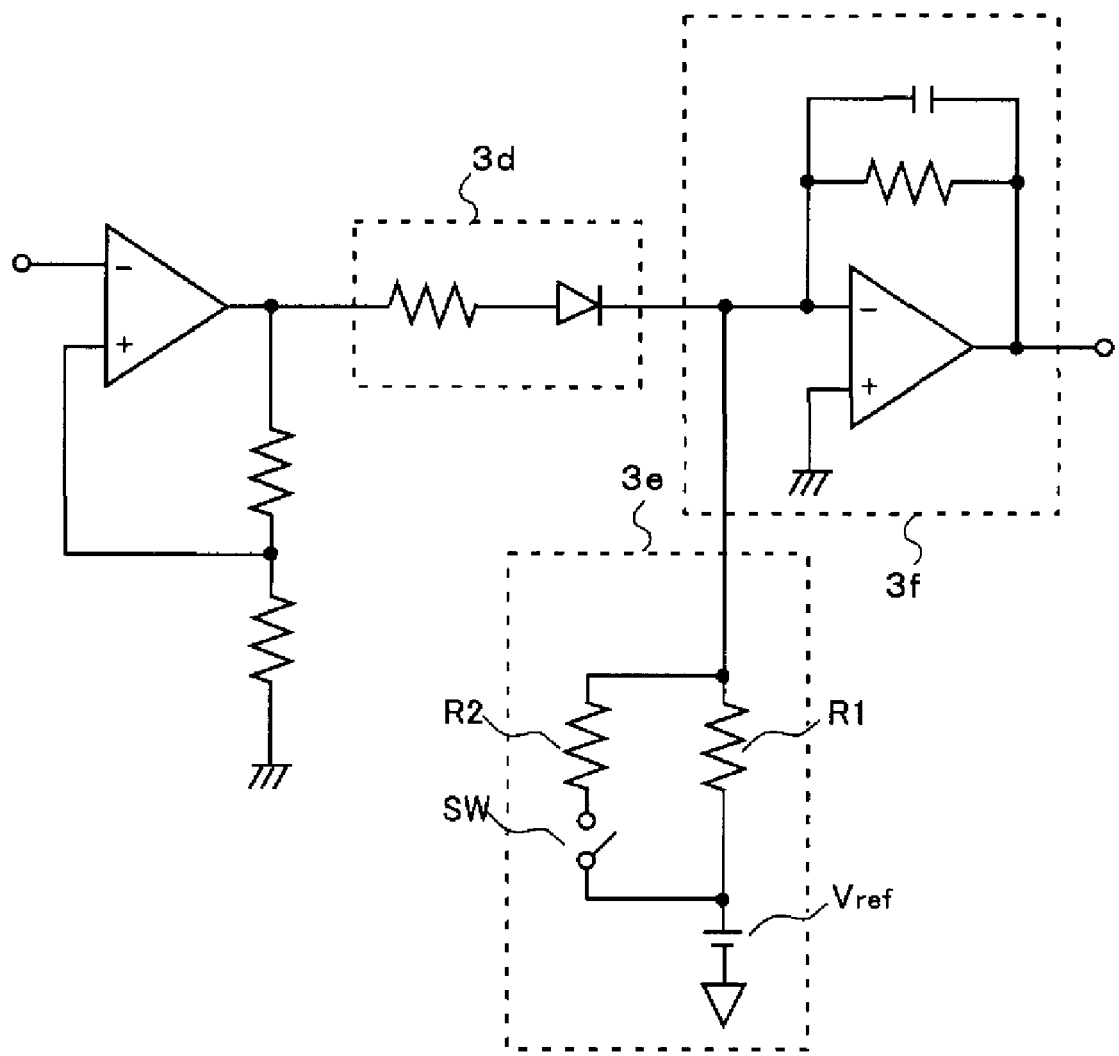
FIG. 11 shows another constitutional example of the automatic gain control circuit of the present invention.

A constitutional example of the oscillation device that outputs a predetermined frequency signal will be described next using FIGS. 3 to 15 and a constitutional example of the gyroscope device will be described using FIGS. 16 to 23. In addition, FIGS. 3 to 5 show a constitutional example of an oscillation device in which an oscillation circuit performs constant current control, while FIGS. 6 to 8 show a constitutional example of an oscillation device in which an oscillation circuit performs constant voltage control. FIGS. 9 to 11 shows a constitutional example of an automatic gain control circuit and FIGS. 12 to 15 shows a set example of the oscillation frequency during examination.

In addition, FIGS. 16 to 23 illustrate examples of gyroscope devices and show a case where the oscillation device that the gyroscope device comprises performs constant current control.

First, the constitutional example of the oscillation device comprising the oscillation circuit that performs constant current control will be described using FIGS. 3 to 5. FIG. 3 is a constitutional example that corresponds to the form shown in FIG. 1A and comprises an output terminal and detection terminal. FIG. 4 is a constitutional example that corresponds to the form shown in FIG. 1B and is an example in which the drive signal switch circuit connected to the detection terminal is constituted by a first switch circuit and a second switch circuit. FIG. 5 is a constitutional example that corresponds to the form shown in FIG. 1C and comprises only an output terminal.

In FIG. 3, the oscillation device 1A comprises a piezoelectric element 2 and an oscillation circuit 3 that drives the oscillation of the piezoelectric element 2. The oscillation circuit 3 comprises a current/voltage conversion circuit 3a that converts the output current of one drive electrode of the piezoelectric element 2 into an AC voltage, a lowpass filter (LPF) 3b that removes the high frequency component of the AC voltage thus converted, and a variable gain amplifier 3c that forms a drive signal for oscillation driving by adjusting the gain of the AC voltage. The closed circuit 4 is formed as a result of supplying the output voltage of the variable gain amplifier 3c to the other drive electrode of the piezoelectric element 2 as a piezoelectric element drive signal.

For the variable gain amplifier 3c, adjustment of the gain is carried out by the automatic gain control circuit (AGC circuit). Here, the automatic gain control circuit (AGC circuit) performs constant current control and the variable gain amplifier 3c is controlled so that the current of the drive signal of the piezoelectric element 2 is a constant current. The automatic gain control circuit (AGC circuit) comprises, for example, a rectification circuit 3d that rectifies the output signal of the current/voltage conversion circuit 3a, a reference signal 3e that corresponds to the current value of the constant current, and a comparison circuit 3f that compares the output signal of the rectification circuit 3d and the reference signal 3e, wherein the gain of the variable gain amplifier 3c is adjusted by using the difference signal for the difference between the output signal and reference signal 3e.

The closed circuit 4 may also comprise a buffer amplifier between the current/voltage conversion circuit 3a and the LPF 3b or between the variable gain amplifier 3c and the drive electrode of the piezoelectric element 2, for example.

The oscillation circuit 3 of the oscillation device 1A outputs a current signal that has been converted into a voltage by the current/voltage conversion circuit 3a from the output terminal 22 as an output signal. The oscillation circuit 3 is driven by means of a drive signal that is obtained as a result of performing the constant current control of the piezoelectric element 2 as mentioned earlier and, therefore, the output signal that is output by the output terminal 22 is a frequency signal with a constant current value. The oscillation device 1A outputs the output signal as a frequency signal of a predetermined frequency.

Meanwhile, the detection terminal 21 is connected via the drive signal switch circuit 11 to a node between the variable gain amplifier 3c of the oscillation circuit 3 and the piezoelectric element 2 and the drive signal that drives the piezoelectric element 2 is output to the outside. The drive signal contains voltage information that is applied to the piezoelectric element 2 because the oscillation circuit 3 performs constant current control.

The oscillation device 1A always outputs an output signal of a predetermined frequency from the output terminal 22 irrespective of the ON/OFF state of the drive signal switch circuit 11. However, in cases where the equivalent serial resistance value of the piezoelectric element 2 is measured, the drive signal is taken from the detection terminal 21 by setting the drive signal switch circuit 11 to the ON state and voltage information applied to the piezoelectric element 2 is acquired.

In FIG. 4, as per the oscillation device 1A above, in the oscillation device 1B, the drive signal switch circuit 11 is constituted by a first switch circuit 11a and a second switch circuit 11b that operate exclusively and the oscillation device 1B operates in the same way as the oscillation device 1A. A description of the operation is omitted here.

The first switch circuit 11a is connected between the detection terminal 21 and the closed circuit 4 of the oscillation circuit 3 and the second switch circuit 11b is connected between the detection terminal 21 and a standing potential such as ground. The first switch circuit 11a and the second switch circuit 11b operate exclusively such that, when the first switch circuit 11a is in the ON state, the second switch circuit 11b is in the OFF state. Conversely, in cases where the first switch circuit 11a is in the OFF state, the second switch circuit 11b is in the ON state.

In cases where the first switch circuit 11a is in the ON state and the second switch circuit 11b is in the OFF state, the closed circuit 4 of the oscillation circuit 3 is electrically connected to the detection terminal 21 and the detection terminal 21 outputs the drive current of the closed circuit 4. However, in cases where the first switch circuit 11a is in the OFF state and the second switch circuit 11b is in the ON state, the closed circuit 4 of the oscillation circuit 3 is electrically isolated by the detection terminal 21 and the detection terminal 21 is maintained to a standing potential such as ground. The shielding effect as a result of the detection terminal 21 being maintained at a standing potential prevents the invasion of noise into the oscillation device from the outside.

In FIG. 5, the oscillation device 1C comprises the piezoelectric element 2 and the oscillation circuit 3 which drives the oscillation of the piezoelectric element 2 as per the oscillation devices 1A and 1B above. The oscillation circuit 3 can have a similar constitution to that of the oscillation devices 1A and 1B and the description here is omitted. In the case of oscillation device 1C, an oscillation output signal switch circuit 12 is connected between the current/voltage conversion circuit 3a and output terminal 22 and, when the oscillation output signal switch circuit 12 is in the ON state, a current signal that has been converted to a voltage by the current/voltage conversion circuit 3a is output as an output signal from the output terminal 22. The oscillation device 1C outputs the output signal as a frequency signal that has a predetermined frequency.

However, the node between the variable gain amplifier 3c of the oscillation circuit 3 and the piezoelectric element 2 is connected to the output terminal 22 via the drive signal switch circuit 11 and a drive signal that drives the piezoelectric element 2 is output from the output terminal 22 to the outside. The drive signal obtained via the drive signal switch circuit 11 contains voltage information that is applied to the piezoelectric element 2 because the oscillation circuit 3 performs constant current control.

The oscillation device 1C is constituted comprising only one output terminal 22 as a terminal that outputs a signal from the oscillation circuit 3 to the outside and, therefore, drives the drive signal switch circuit 11 and the oscillation output signal switch circuit 12 exclusively. By setting only one of the switch circuits in an ON state and setting the other in an OFF state, only either one of the output signal and the drive signal is output from the output terminal 22.

In cases where the oscillation output signal switch circuit 12 is set to an ON state and the drive signal switch circuit 11 is set to an OFF state, an output signal of a predetermined frequency is output by the output terminal 22. Conversely, in cases where the oscillation output signal switch circuit 12 is in the OFF state and the drive signal switch circuit 11 is in the ON state, a drive signal is output by the output terminal 22.

Therefore, in cases where the equivalent serial resistance value of the piezoelectric element 2 is measured, the drive signal is taken from the output terminal 22 by setting the drive signal switch circuit 11 to the ON state and setting the oscillation output signal switch circuit 12 to the OFF state, and voltage information that is applied to the piezoelectric element 2 is acquired.

In the case of the circuit constitution shown in FIGS. 3 to 5, because the oscillation circuit performs constant current control, the equivalent serial resistance value of the piezoelectric element 2 can be determined from the current/voltage relationship on the basis of the voltage information of the drive signal and the current information for the constant current control. The current information of the piezoelectric element may employ a current value that is obtained by the output signal that is output by the output terminal 22 in addition to using a current value that is established in the constant current control of the oscillation circuit 3.

A constitutional example of an oscillation device that comprises an oscillation circuit that performs voltage control will be described next by using FIGS. 6 to 8. FIG. 6 corresponds to the form shown in FIG. 1A and is a constitutional example comprising an output terminal and a detection terminal. FIG. 7 corresponds to the form shown in FIG. 1B and is an example in which the drive signal switch circuit connected to the detection terminal is constituted by a first switch circuit and a second switch circuit. FIG. 8 corresponds to the form shown in FIG. 1C and is a constitutional example that comprises only the output terminal.

In FIG. 6, the oscillation device 1D comprises the piezoelectric element 2 and the oscillation circuit 3 that drives the oscillation of the piezoelectric element 2. The oscillation circuit 3 comprises the current/voltage conversion circuit 3a that converts the output current of one drive electrode of the piezoelectric element 2 into an AC voltage, the lowpass filter (LPF) 3b that removes the high frequency component of the converted AC voltage, and the variable gain amplifier 3c which forms a drive signal for oscillation drive by adjusting the gain of the AC voltage, wherein the closed circuit 4 is formed by supplying the output voltage of the variable gain amplifier 3c to the other drive electrode of the piezoelectric element 2 as the drive signal of the piezoelectric element.

The variable gain amplifier 3c performs a gain adjustment by means of the automatic gain control circuit (AGC circuit). Here, the automatic gain control circuit (AGC circuit) performs constant voltage control and the variable gain amplifier 3c is controlled such that the voltage of the drive signal of the piezoelectric element 2 is a constant voltage. The automatic gain control circuit (AGC circuit) comprises, for example, a rectification circuit 3d that rectifies the output signal of the variable gain amplifier 3c, a reference signal 3e that corresponds to the voltage value of the constant voltage, and a comparison circuit 3f that compares the output signal of the rectification circuit 3d and the reference signal 3e, wherein the gain of the variable gain amplifier 3c is adjusted by using the difference signal for the difference between the output signal and the reference signal 3e.

The closed circuit 4 may also comprise a buffer amplifier between the current/voltage conversion circuit 3a and LPF 3b or between the variable gain amplifier 3c and the drive electrode of the piezoelectric element 2, for example.

In the case of the oscillation circuit 3 of the oscillation device 1D, the output terminal 22 is connected to the node between the variable gain amplifier 3c of the oscillation circuit 3 and the piezoelectric element 2 and the voltage signal of the variable gain amplifier 3c is output from the output terminal 22 as an output signal. The oscillation circuit 3 is driven by the drive signal that controls the piezoelectric element 2 at a constant voltage as mentioned earlier and, therefore, the output signal that is output from the output terminal 22 is a frequency signal of a constant voltage value. The oscillation device 1D outputs the output signal as a frequency signal of a predetermined frequency.

However, the detection terminal 21 is connected via the drive signal switch circuit 11 to the node between the current/voltage conversion circuit 3a and the LPF 3b and the drive signal that drives the piezoelectric element 2 is output to the outside. The drive signal contains current information that is output by the piezoelectric element 2 because the oscillation circuit 3 is subjected to constant voltage control.

The oscillation device 1D outputs always outputs an output signal of a predetermined frequency from the output terminal 22 irrespective of the ON/OFF state of the drive signal switch circuit 11. However, in cases where the equivalent serial resistance value of the piezoelectric element 2 is measured, the drive signal is taken from the detection terminal 21 by setting the drive signal switch circuit 11 to the ON state and current information that is output from the piezoelectric element 2 is acquired.

In FIG. 7, as per the oscillation device 1D above, in the oscillation device 1E, the drive signal switch circuit 11 is constituted by a first switch circuit 11a and a second switch circuit 11b that operate exclusively and operates in the same way as the oscillation device 1D. A description of the operation is omitted here.

The first switch circuit 11a is connected between the detection terminal 21 and the current/voltage conversion circuit 3a and the second switch circuit 11b is connected between the detection terminal 21 and a standing potential such as ground. The first switch circuit 11a and the second switch circuit 11b operate exclusively such that, when the first switch circuit 11a is in the ON state, the second switch circuit 11b is in the OFF state. Conversely, in cases where the first switch circuit 11a is in the OFF state, the second switch circuit 11b is in the ON state.

In cases where the first switch circuit 11a is in the ON state and the second switch circuit 11b is in the OFF state, the current/voltage conversion circuit 3a is electrically connected to the detection terminal 21 and the detection terminal 21 outputs the current/voltage conversion output $V_{IV}$. However, in cases where the first switch circuit 11a is in the OFF state and the second switch circuit 11b is in the ON state, the current/voltage conversion circuit 3a is electrically isolated by the detection terminal 21 and the detection terminal 21 is maintained to a standing potential such as ground. The shielding effect as a result of the detection terminal 21 being maintained at a standing potential prevents the invasion of noise into the oscillation device from the outside.

In FIG. 8, an oscillation device 1F comprises the piezoelectric element 2 and the oscillation circuit 3 which drives the oscillation of the piezoelectric element 2 as per the oscillation devices 1D and 1E above. The oscillation circuit 3 can have a similar constitution to that of the oscillation devices 1D and 1E and the description here is omitted. In the case of oscillation device 1F, the output terminal 22 is connected via the oscillation output signal switch circuit 12 to the node between the variable gain amplifier 3c of the oscillation circuit 3 and the piezoelectric element 2 and an output signal is output to the outside from the output terminal 22. The oscillation device 1F outputs the output signal as a frequency signal that has a predetermined frequency.

However, the drive signal switch circuit 11 is connected between the current/voltage conversion circuit 3a and the output terminal 22 and, when the drive signal switch circuit 11 is in the ON state, a current signal that has been converted into a voltage by the current/voltage conversion circuit 3a is output by the output terminal 22 as a drive signal.

The drive signal that is obtained via the drive signal switch circuit 11 contains current information that is output by the piezoelectric element 2 because the oscillation circuit 3 is subjected to constant voltage control.

The oscillation device 1F is constituted comprising only one output terminal 22 as a terminal that outputs a signal to the outside from the oscillation circuit and, therefore, exclusively drives the drive signal switch circuit 11 and oscillation output signal switch circuit 12 and, by setting only either one of the switch circuits to the ON state and the other switch circuit to the OFF state, only one of the output signal or drive signal is output by the output terminal 22.

In cases where the drive signal switch circuit 11 is set to the OFF state and the oscillation output signal switch circuit 12 is set to the ON state, an output signal of a predetermined frequency is output from the output terminal 22 and, conversely, in cases where the drive signal switch circuit 11 is set to the ON state and the oscillation output signal switch circuit 12 is set to the OFF state, the drive signal is output from the output terminal 22.

Therefore, in cases where the equivalent serial resistance value of the piezoelectric element 2 is measured, the drive signal is taken from the output terminal 22 by setting the drive signal switch circuit 11 to the ON state and setting the oscillation output signal switch circuit 12 to the OFF state, and the current information that is output from the piezoelectric element 2 is acquired.

Since the oscillation circuit is subject to constant voltage control in the constitution of the oscillation devices 1D, 1E, and 1F shown in FIGS. 6 to 8, the equivalent serial resistance value of the piezoelectric element 2 can be determined from the current/voltage relationship on the basis of the current information of the drive signal and the voltage information of the constant voltage control. The voltage information of the piezoelectric element may also employ the voltage value obtained from the output signal that is output by the output terminal 22 in addition to using the voltage value that is set in the constant voltage control of the oscillation circuit 3.

FIG. 9 serves to illustrate one circuit constitution of the automatic gain control circuit that the oscillation devices 1A to 1F each comprise. In FIG. 9, the automatic gain control circuit is constituted by a non-inverting amplifier that amplifies an AC output voltage, a rectification circuit 3d that converts the output voltage of the non-inverting amplifier into a DC current, a reference power circuit 3e that outputs a constant reference current irrespective of the supply voltage fluctuations and temperature variation, and the comparison circuit 3f that supplies a control voltage based on the difference in current from the reference current to the variable gain amplifier 3c.

The oscillation device of the present invention varies the size of the signal during each operation when the equivalent serial resistance value of the piezoelectric element is measured and when the oscillation voltage is obtained by driving the oscillation of the piezoelectric element, thereby setting the size of the signal during measurement smaller than the size of the signal during normal oscillation. As a result of regular operation, the measurement time of the equivalent serial resistance value of the piezoelectric element is shortened.

In cases where the piezoelectric element is subjected to constant voltage control, the voltage value of the output voltage during measurement of the equivalent serial resistance value of the piezoelectric element is set to a smaller value than the voltage value of the output voltage during the oscillation operation of the piezoelectric element. Further, in cases where the piezoelectric element is subjected to constant current control, the current value of the output current during measurement of the equivalent serial resistance value of the piezoelectric element is set to a smaller value than the current value of the output current during the oscillation operation of the piezoelectric element.

These settings are explained using the signal in FIG. 10 and the circuit constitution in FIG. 11. In the automatic gain control circuit shown in FIG. 9, the automatic gain control is performed by using the comparison circuit 3f to determine the current difference between the output current Is rectified by the rectification circuit 3d and the reference current Iref generated by the reference power circuit 3e and by supplying the current difference to the variable gain amplifier 3c.

Here, the current Is determined by the automatic gain control circuit varies in accordance with the reference current Iref. The signal diagram in FIG. 10 illustrates the variation of the state where the current Is is stable after the supply voltage has been applied in the automatic gain control circuit and FIG. 10A shows the supply voltage, FIG. 10B shows the variation in the current during normal oscillation, and FIG. 10C shows the variation in the current during measurement.

In FIGS. 10B and 10C, the output current Is increases in accordance with a predetermined time constant that is determined from the Q value of the piezoelectric element after the supply voltage has been applied and, in the comparison circuit 3f, the size of the output current Is is made to match the reference current Iref by stopping the increase in the current at the point where the reference current Iref is reached.

In the variation of the current during the normal oscillation shown in FIG. 10B, the output current Is increases until reference current Iref1 is reached and, at the point where the reference current Iref1 is reached, is held at that current value. In FIG. 10B, the time required until the reference current Iref1 is reached after the drive voltage is applied is expressed by t1.

In addition, in the variation of the current during measurement shown in FIG. 10C, the output current Is increases until the reference current Iref2 is reached and, at the point where the reference current Iref2 is reached, is held at the current value. In FIG. 10C, the time required to reach the reference current Iref2 after the drive voltage is applied is denoted by t2.

Here, by setting the size of the reference current Iref2 during measurement smaller than the size of the reference current Iref1 during normal oscillation, the time t2 required for stabilization during measurement can be made shorter than time t1 required for stabilization during normal oscillation. As a result, the time required to perform measurement can be shortened by $\Delta t(=t1-t2)$ in comparison with a case where a measurement operation is carried out using the reference current Iref1 that is used during normal oscillation.

FIG. 11 shows a constitutional example that allows switching of the reference current, which is another constitutional example of the automatic gain control circuit. In the automatic gain control circuit, the reference power circuit 3e is constituted such that the reference voltage Vref is connected to a node that connects a serial connection between a resistor R2 and a switch SW, and a resistor R1 in parallel.

With this constitution, in cases where the switch SW is in the ON state, the reference current Iref1 that is determined by 2 (GND−Vref)/R1 (when R1=R2) is obtained and switch SW is in the OFF state, the reference current Iref2 that is determined by the (GND−Vref)/R1 is obtained. Here, the reference current Iref2 is a smaller current than the reference current Iref1.

R1 and R2 determine the current values of the reference current Iref1 and reference current Iref2 and can be determined in accordance with the output currents Is1 and Is2.

Next, FIGS. 12 to 15 will be used to describe an aspect in which a high measurement accuracy is obtained for measuring the equivalent serial resistance value of the piezoelectric element by using the resonance frequency of the piezoelectric element during examination and measurement of the equivalent serial resistance value of the piezoelectric element and by using a value closer to the serial resonance frequency of the piezoelectric element than the oscillation frequency used during the oscillation operation of the piezoelectric element.

FIG. 12 serves to illustrate the frequency characteristic of the impedance and the phase of the piezoelectric element. FIG. 13 serves to illustrate the oscillation conditions of the piezoelectric element and oscillation circuit. FIG. 14 serves to illustrate a circuit example that switches the frequency of the oscillation circuit. FIG. 15 serves to illustrate the frequency characteristic of the frequency switching circuit of the oscillation circuit.

When the piezoelectric element is made to oscillate at the serial resonance frequency, a high Q value is obtained and a large amplitude is obtained. However, normally, the oscillation circuit of the oscillation device is excited and made to oscillate so as to oscillate at a frequency that is shifted from the serial resonance frequency of the piezoelectric element. This is because, even when the frequency characteristic of the oscillation circuit is displaced as a result of an environmental change such as the temperature, a margin is retained in correspondence with the fluctuation in the frequency characteristic of the oscillation circuit so that the phase condition which is the oscillation condition is satisfied.

FIG. 12 shows the frequency characteristic of the piezoelectric element. FIG. 12A shows the frequency characteristic of the impedance and FIG. 12B shows the frequency characteristic of the phase.

Conditions for oscillation include phase conditions such as phase lag (in + direction). The oscillation circuit must determine the frequency within a range satisfying the phase condition and oscillation is impossible in cases where there is a shift from the phase condition. However, although a large amplitude can be obtained through oscillation at the frequency of the serial resonance point, because the phase characteristic of the serial resonance point is at the boundary between phase lead and phase lag, in cases where the frequency characteristic of the oscillation circuit fluctuates due to an environmental change such as the temperature, there is the risk that the phase conditions will not be satisfied and the oscillation operation will be impossible. Therefore, usually, in a normal oscillation operation, the oscillation frequency of the piezoelectric element is set with the frequency displaced by a margin of a predetermined size from the frequency of the serial resonance point so that stable oscillation is continuous even when fluctuations in the frequency characteristic of the oscillation circuit occur. "f1" in FIG. 12A represents the normal oscillation frequency.

In the examination of the piezoelectric element, in measurement of the equivalent serial resistance value of the piezoelectric element, the closer the value is to the serial resonance frequency of the piezoelectric element, the smaller the measurement error of the equivalent serial resistance value of the piezoelectric element obtained in the measurement and the measurement accuracy of the CI value determined from the serial resistance value increases.

In the measurement of the equivalent serial resistance value of the piezoelectric element, in cases where the oscillation frequency used for the normal oscillation of the piezoelectric element is used, the oscillation frequency is a frequency that is displaced by a margin from the frequency of the serial resonance point and, therefore, a high measurement accuracy cannot be obtained.

Therefore, in an aspect of the detection method of the piezoelectric element of the present invention, a value that is closer to the serial resonance frequency of the piezoelectric element than the oscillation frequency used for normal oscillation is employed, whereby a high measurement accuracy is obtained. "f2" in FIG. 12A represents the oscillation frequency during measurement.

Because, during measurement, the temperature is stable in comparison with during an oscillation operation, there is little hindrance to measurement even when environmental conditions such as the temperature are made more lenient than during the oscillation operation.

The oscillation frequency of the piezoelectric element can be determined using a frequency characteristic of the oscillation circuit that forms a closed circuit through a connection with the piezoelectric element. FIG. 13 illustrates the oscillation conditions for a closed circuit that is formed by a piezoelectric element and an oscillation circuit.

Figure 13A:
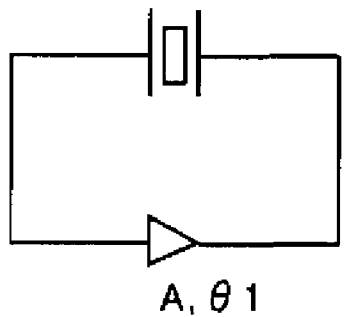
FIG. 13 serves to illustrate the oscillation conditions for the piezoelectric element and the oscillation circuit of the present invention.
Figure 14:
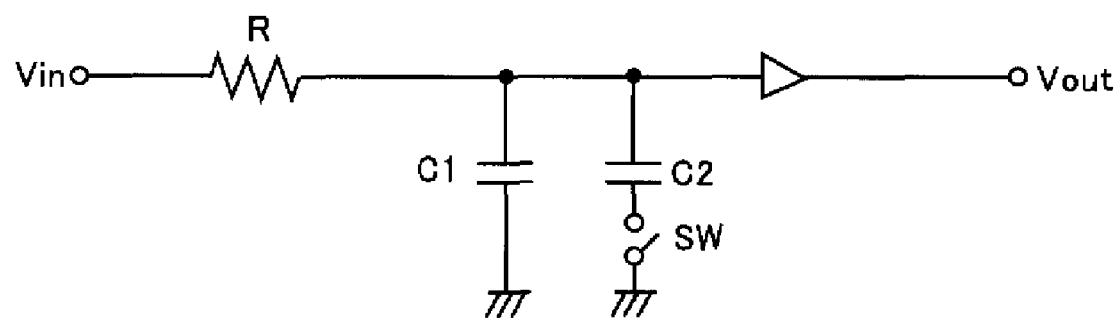
FIG. 14 serves to illustrate an example of a circuit for switching the frequency characteristic of the oscillation circuit of the present invention.

In FIG. 13A, the oscillation conditions for the whole closed circuit that is formed by a piezoelectric element and oscillation circuit include a gain condition and a phase condition. The gain condition satisfies "$A \cdot \beta \geq 1$" where the product "$A \cdot \beta$" of the amplification factor A of the oscillation circuit and the attenuation rate $\beta$ of the piezoelectric element is equal to or more than 1 and the phase condition is the condition "$\theta 1 + \theta 2 = 2n\pi$" where the sum of the phase $\theta 1$ of the oscillation circuit and the phase $\theta 2$ of the piezoelectric element is an integer multiple of $2\pi$. Here, n is an integer.

Figure 13B:
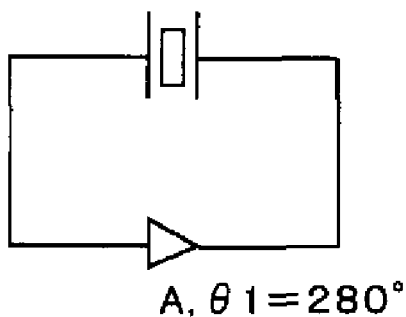

FIG. 13B represents an example of the oscillation of the whole closed circuit during a normal oscillation operation. In a normal oscillation operation, the oscillation frequency is set at a frequency f1, which is displaced from the serial resonance point by making settings such that the phase of the piezoelectric element has a phase lag of 80°, for example.

The phase lag of the piezoelectric element can be determined by setting the frequency characteristic of the oscillation circuit to satisfy the phase conditions of the whole closed circuit formed by the piezoelectric element and the oscillation circuit. For example, by causing oscillation such that the phase $\theta 1$ of the oscillation circuit is 280°, the phase $\theta 2$ of the piezoelectric element can be set at 80°.

Figure 13C:
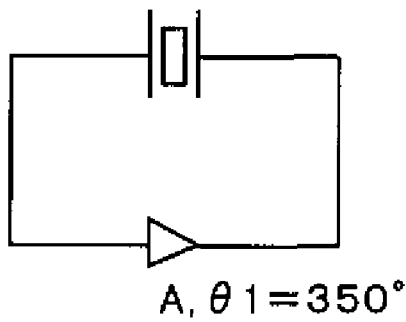

In addition, FIG. 13C shows an example of the whole closed circuit during examination of the piezoelectric element. In an examination operation, for example, the oscillation frequency is set at a frequency f2, which is close to the serial resonance point by setting the phase of the piezoelectric element with a phase lag of 10°. The relationship is such that frequency f2<frequency f1.

The phase lag of the piezoelectric element can be determined by setting the frequency characteristic of the oscillation circuit to satisfy the phase conditions of the whole closed circuit formed by a piezoelectric element and oscillation circuit and, by causing oscillation with the phase $\theta 1$ of the oscillation circuit at 350°, the phase $\theta 2$ of the piezoelectric element can be set at 10°.

The setting of the phase of the oscillation circuit can be performed by using various circuit constitutions. FIG. 14 shows an example that employs LPF3b that the oscillation circuit 3 comprises.

FIG. 14 is a constitutional example in which the LPF (Low Pass Filter) is formed by an RC circuit of a resistor R and a capacitor C. In the RC circuit, capacitor C is constituted by a parallel connection between a capacitor C2 that connects a switch SW and a capacitor C1.

In this circuit constitution, the cutoff frequency fc1 in a case where the switch SW is in the OFF state is "$1/(2\pi \cdot C1 \cdot R)$", whereas the cutoff frequency fc2 in a case where the switch SW is in the ON state is "$1/(2\pi \cdot (C1+C2) \cdot R)$".

Figure 15A:
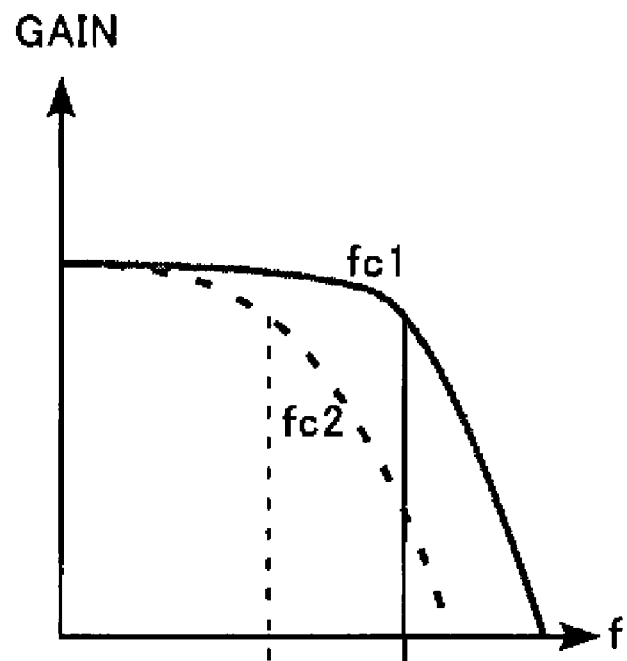
FIG. 15 serves to illustrate the frequency characteristic of the frequency switching circuit of the oscillation circuit of the present invention.
Figure 15B:
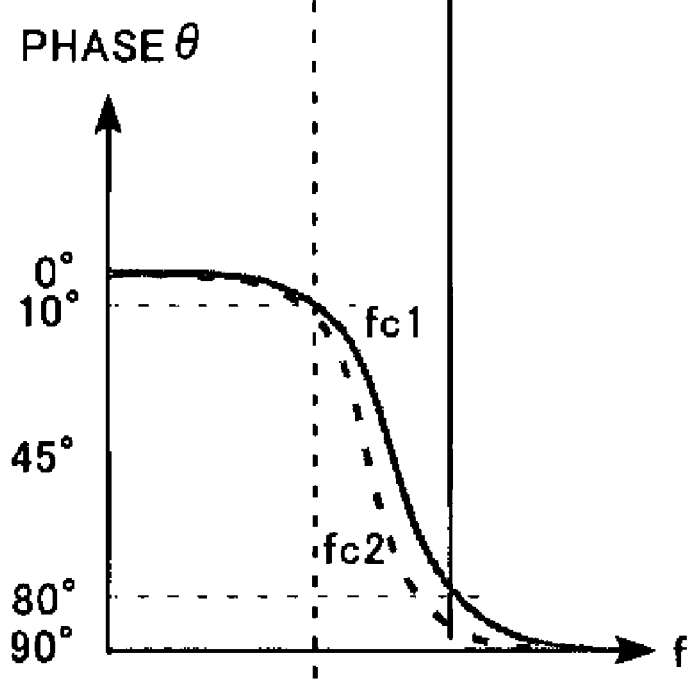

FIG. 15A shows the frequency characteristic of the LPF gain and FIG. 15B shows the frequency characteristic of the phase. In the case of the frequency characteristic in FIG. 15, the solid line represents the frequency characteristic in cases where the switch SW is in the OFF state and the broken line represents the frequency characteristic in cases where the switch SW is in the ON state.

In the case of the frequency characteristic of the phase shown in FIG. 15B, if the switch SW assumes the OFF state during normal oscillation, the cutoff frequency of the LPF is then fc1=$1/(2\pi \cdot C1-R)$" and the phase at this time is $\theta c1$. However, when switch SW assumes an ON state during the examination, the LPF cutoff frequency drops to fc2=$1/(2\pi \cdot C1+C2) \cdot R)$" and the phase lags by $\theta c1$.

Here, assuming that the oscillation frequency f1 during normal oscillation in FIG. 12 is the LPF cutoff frequency fc1 and that the oscillation frequency f2 during examination is the LPF cutoff frequency fc2, by establishing the value of the LPF capacitor C1 such that the phase θ1 during normal oscillation is 280°, the phase θ2 of the piezoelectric element during normal oscillation can be set at 80°. Further, by establishing the values of the LPF capacitors C1 and C2 such that phase θ1 during examination is 350°, phase θ2 of the piezoelectric element during examination can be set at 10°.

In the RC circuit consisting of the resistor R and capacitor C shown in FIG. 14, because the phase is delayed in theory only upper limit of 90°, in reality, multiple stages or an inverter with a phase lag of 180°, or the like, is also used.

As mentioned earlier, by adjusting the frequency characteristic of the LPF, for example, in the oscillation circuit, the oscillation frequency of the piezoelectric element can be changed in an examination and during normal oscillation, the oscillation frequency of the piezoelectric element during examination can be established close to the serial resonance point of the piezoelectric element and, accordingly, a high measurement accuracy can be obtained.

An example of a gyroscope device will be described next by using FIGS. 16 to 23. Here, an example where the oscillation circuit with which the gyroscope device is equipped comprises an oscillation device that performs constant current control is shown.

Figure 16:
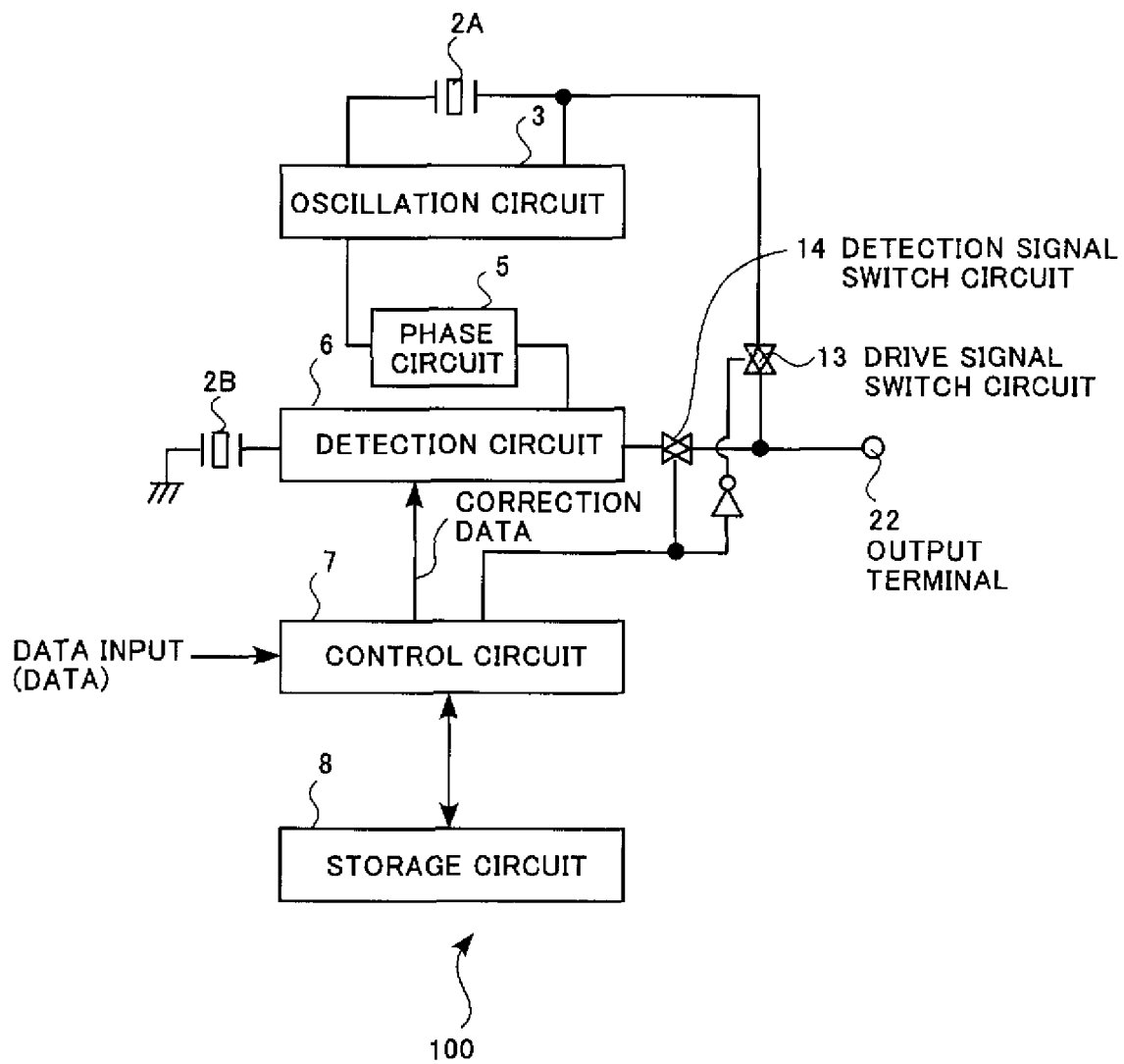
FIG. 16 is a block diagram serving to provide an overview of the gyroscope device of the present invention.

FIG. 16 is a block diagram that serves to provide an overview of a gyroscope device 100. In FIG. 16, the gyroscope device 100 comprises piezoelectric elements 2A and 2B and an oscillation device is constituted by the oscillation circuit 3 with the piezoelectric element 2A serving as an oscillation element. Detection of the angular velocity is performed with the piezoelectric element 2B serving as a detection element. Further, by causing the driven element to vibrate at a predetermined frequency, the detection element is also made to vibrate at a predetermined frequency and the angular velocity is measured by detecting the output signal of the detection element that varies as a result of the Coriolis force that arises due to the external angular velocity. Here, the oscillation device, which is constituted by the piezoelectric element 2A and oscillation circuit 3, employs an oscillation device that comprises an oscillation circuit of the constant current control described in FIGS. 3 to 5.

The gyroscope device 100 detects the output signal of the piezoelectric element 2B that constitutes the detection element by means of a detection circuit 6 and outputs the output signal of the detection circuit 6 from the output terminal 22. The detection circuit 6 obtains the output signal in sync with the phase of the output signal of the piezoelectric element 2B by means of the phase circuit 5 for the sake of establishing synchronicity with the oscillation state of the oscillation circuit 3.

In addition, the detection circuit 6 comprises a control circuit 7 and storage circuit 8 for the sake of correcting the displacement in the output signal that arises on the basis of inconsistencies in the piezoelectric element and other circuit elements and so forth. Correction data that correct the displacement in the output signal are pre-determined and the correction data are input to the control circuit 7 and stored in the storage circuit 8.

The control circuit 7 has the correction data input thereto or reads the correction data stored in the storage circuit 8, adjusts the gain of the amplifier circuit that the detection circuit 6 comprises on the basis of the correction data, and thereby corrects errors of the output signal.

The gyroscope device 100 does not comprise a device-specific measurement terminal for measuring the equivalent serial resistance value of the piezoelectric element 2A which is a driven element, comprising only the output terminal 22 that outputs an output signal obtained from the piezoelectric element 2B constituting the detection element to the outside. Hence, the drive signal of the piezoelectric element used to measure the equivalent serial resistance value of the piezoelectric element 2A must also be output to the outside via the output terminal 22.

Therefore, the gyroscope device 100 of the present invention comprises a drive signal switch circuit 13 that performs drive signal output control between the output terminal 22 and the node that lies between the oscillation device-side piezoelectric element 2A and the oscillation circuit 3 and comprises a detection signal switch circuit 14 that performs output control of the output signal between the detection circuit 6 and output terminal 22. The gyroscope device 100 performs exclusive ON/OFF control for the drive signal switch circuit 13 and detection signal switch circuit 14, and selectively outputs the drive signal and output signal from one output terminal 22 by turning either one of the switch circuits to the ON state and the other switch circuit to the OFF state.

In cases where the gyroscope device 100 performs angular velocity detection which is the object function, the drive signal switch circuit 13 is set to the OFF state and the detection signal switch circuit 14 is set to the ON state, whereby the output signal from the detection circuit 6 is output to the outside from the output terminal 22. However, in cases where the equivalent serial resistance value of the piezoelectric element 2A of the oscillation device that the gyroscope device 100 comprises is determined, the drive signal switch circuit 13 is set to the ON state and the detection signal switch circuit 14 is set to the OFF state, whereby the drive signal of the oscillation device is output to the outside from the output terminal 22.

The switching of the drive signal switch circuit 13 and detection signal switch circuit 14 can be carried out by means of a control signal from the control circuit 7. In FIG. 16, by inverting the control signal through the interposition of a NOT circuit between the control circuit 7 and drive signal switch circuit 13, the drive signal switch circuit 13 and detection signal switch circuit 14 can be driven exclusively.

Figure 17:
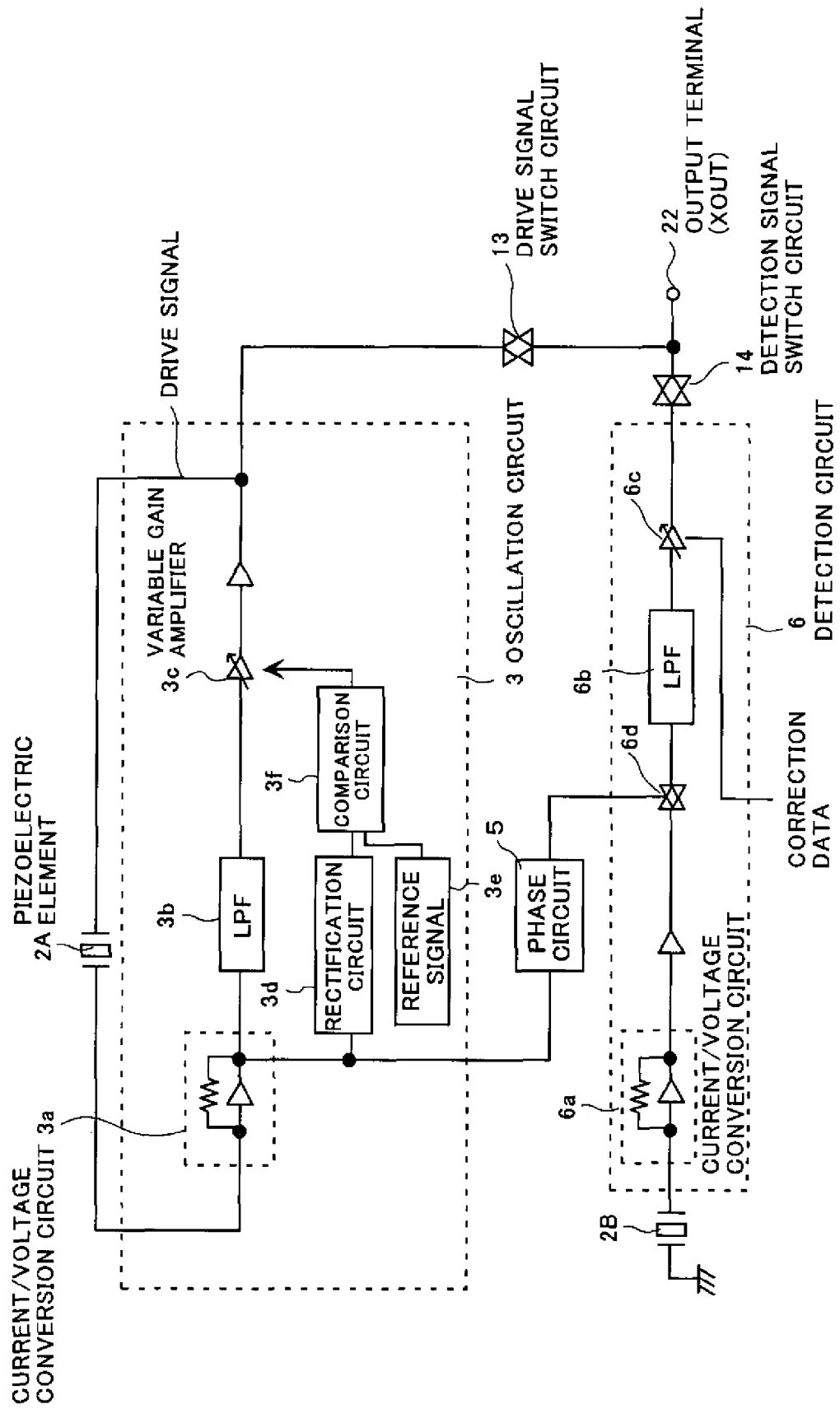
FIG. 17 serves to illustrate a constitutional example of the oscillation circuit and detection circuit which constitute the gyroscope device of the present invention.

FIG. 17 serves to illustrate a constitutional example of the oscillation circuit 3 and a constitutional example of the detection circuit 6, which the gyroscope device 100 of the present invention comprises.

Because the oscillation circuit that the gyroscope device 100 comprises performs constant current control, the constitution of the oscillation circuit 3 can be made the same as the constitution shown in FIGS. 3 to 5 above. Therefore, the description of the constitution of the oscillation circuit 3 is omitted here. The drive signal switch circuit 13 is connected between the output terminal 22 and the node that lies between the variable gain amplifier 3c and piezoelectric element 2A of the oscillation circuit 3.

Further, the detection circuit 6 comprises a current/voltage conversion circuit 6a that converts the current signal from the piezoelectric element 2B constituting the detection element into a voltage signal, a synchronized wave detection circuit 6d that performs wave detection in sync with the phase of the drive signal of the oscillation circuit 3 on the basis of the signal from the phase circuit 5, a low pass filter 6b that removes the high frequency components, and a variable gain amplifier 6c that performs gain adjustment on the basis of the correction data. The detection circuit 6 outputs an output signal to the output terminal 22 via the detection signal switch circuit 14. The detection circuit 6 may also comprise a buffer amplifier in addition to the aforementioned parts.

Figure 18:
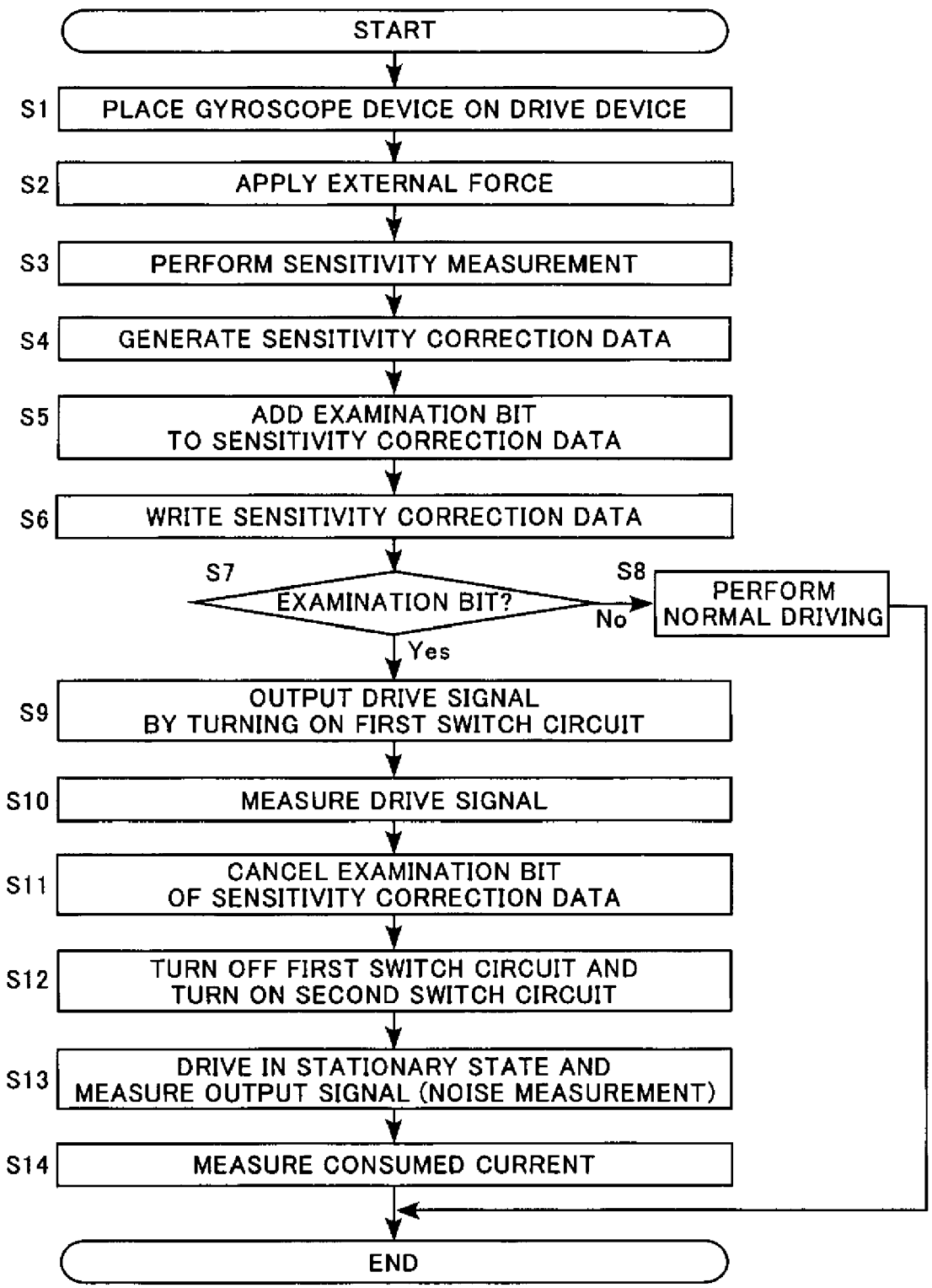
FIG. 18 is a flowchart serving to illustrate a procedure for measuring the equivalent serial resistance value of the piezoelectric element of the gyroscope device and the oscillation device of the present invention.

The procedure for measuring the equivalent serial resistance value of the piezoelectric element in the gyroscope device of the present invention will be described next using the flowchart of FIG. 18, FIG. 19, which serves to illustrate signal relationships during sensitivity measurement, FIG. 20, which provides an overview of correction data, and FIG. 21, which serves to illustrate the output of the drive signal that uses the examination bits contained in the correction data.

In order to measure the equivalent serial resistance value of the piezoelectric element, a drive device for applying an external force to the gyroscope device is prepared and the gyroscope device is placed on the drive device (S1). The drive device rotates the gyroscope device placed thereon by means of a rotational drive section, for example, and the external force is applied to the piezoelectric element that the gyroscope device comprises as a result of the rotation operation (S2).

In a state where the gyroscope device is set as a drive device, an external force is applied with the power of the gyroscope device in the ON state (S2). The detection output at such time is measured by varying the external force applied to the gyroscope device by the drive device (S3). Here, as shown in FIG. 19, with the power in the ON state (FIG. 19A), the direction of rotation of the drive device is reversed from the CW direction to the CCW direction (FIG. 19B), whereupon the sensor output is detected (FIG. 19C).

For the sensor output, an error arises in the output signal as a result of inconsistencies in the piezoelectric element and the other circuit elements. Because, for the sensor output, it is desirable that there be no inconsistencies in the output as a result of the direction of rotation, correction data for correcting such inconsistencies are generated and the gain of the variable gain amplifier 6c of the detection circuit 6 is adjusted. The sensitivity correction data that correct the output of the piezoelectric element can be determined from the difference in the output caused by the difference in the output signal of the sensor output, for example (S4).

Figure 20A:
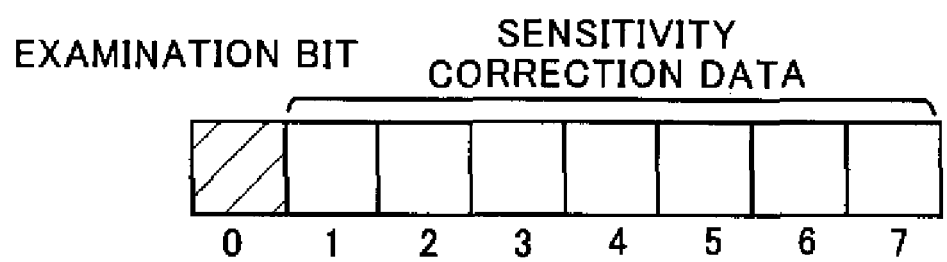
FIG. 20 provides an overview of the correction data of the present invention.

Examination control data for performing control to switch the drive signal switch circuit and detection signal switch circuit are applied to the excess bits of the sensitivity correction data. FIG. 20 is a data example of the sensitivity correction data. Here, an example where all the data lengths are eight bits, of which seven bits are the sensitivity correction data and an LSB bit is used for the examination control data (FIG. 20A). The bit length of the sensitivity correction data is not limited to eight bits and can be optionally determined in accordance with correction accuracy and the constitution of the variable gain amplifier 6c or the like.

Figure 20B:
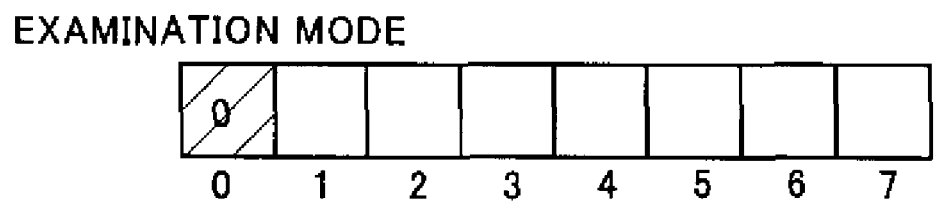
Figure 20C:
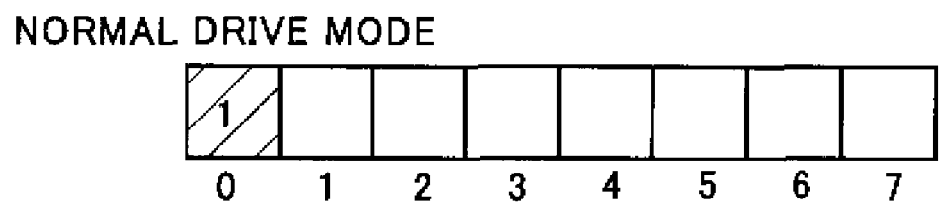

FIG. 20B is a data example of sensitivity correction data for setting an examination mode, where "0" ("low") is set as the examination control data for the LSB bit. In addition, FIG. 20C is a data example of sensitivity correction data for setting the normal drive mode, where "1" ("high") is set as the normal drive control data for the LSI bit. Here, "0" ("low") is set as the control data in order to perform examination (S5). The sensitivity correction data thus generated are input to the control circuit 7 and stored in the storage circuit 8 (S6).

The control circuit 7 reads the sensitivity correction data and judges the examination control data in the sensitivity correction data (S7). In cases where "1" ("high") is set for the control data, the output of the drive signal is stopped with the drive signal switch circuit in the OFF state and an output signal is output from the output terminal 22 with the detection signal switch circuit in the ON state (S8).

However, in cases where "0" ("low") is set for the control data, a drive signal is output from the output terminal 22 with the drive signal switch circuit in the ON state and the output of the output signal is stopped with the detection signal switch circuit in the OFF state. According to this aspect, a drive signal for determining the equivalent serial resistance value of the piezoelectric element can be measured (S9).

In the examination state, the equivalent serial resistance value of the piezoelectric element is calculated on the basis of the drive signal that is output from the output terminal 22 (S10).

After the measurement is complete, the examination mode is canceled by overwriting the examination control bit of the sensitivity correction data from "0" ("low") to "1" ("high") (S11). As a result of overwriting the sensitivity correction data, "1" ("high") is set for the control data and, therefore, the output of the drive signal is stopped with the drive signal switch circuit in the OFF state and an output signal is output from the output terminal 22 with the detection signal switch circuit in the ON state (S12). In the mode state, the oscillation circuit or gyroscope device is in the stationary state and the noise component is measured (S13). Thereafter, measurement of the consumption current is performed (S14).

Figure 21A:
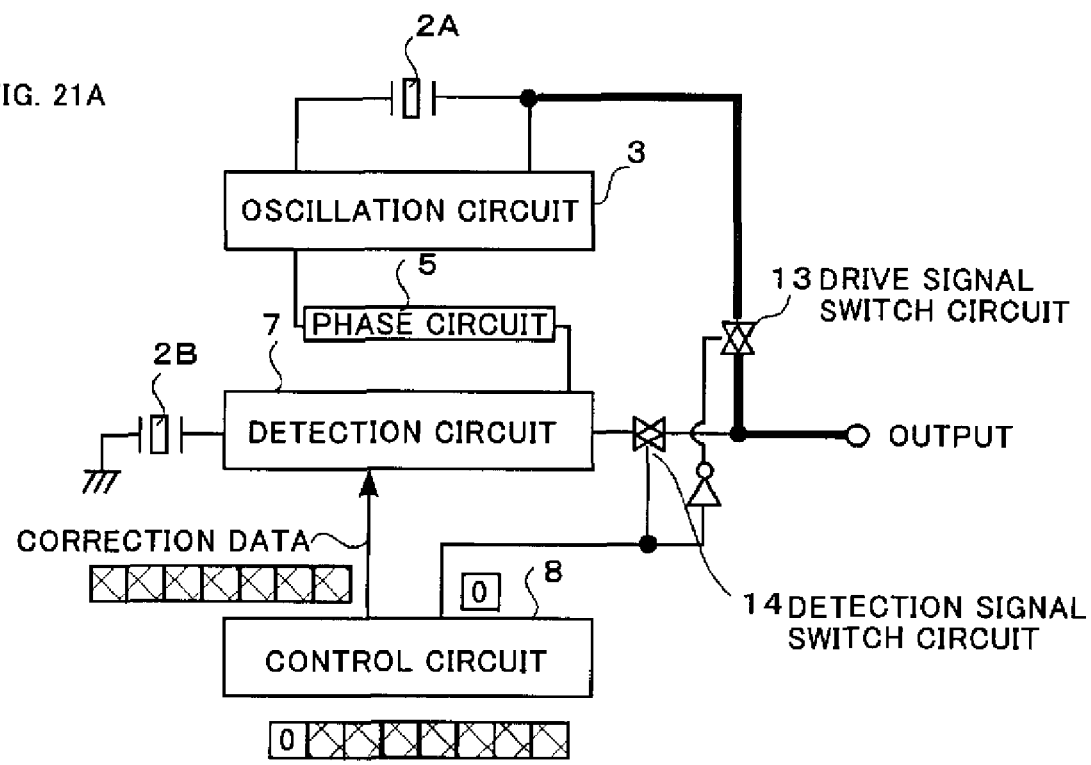
FIG. 21 serves to illustrate the output of the drive signal that uses an examination bit that is contained in the correction data.
Figure 21B:
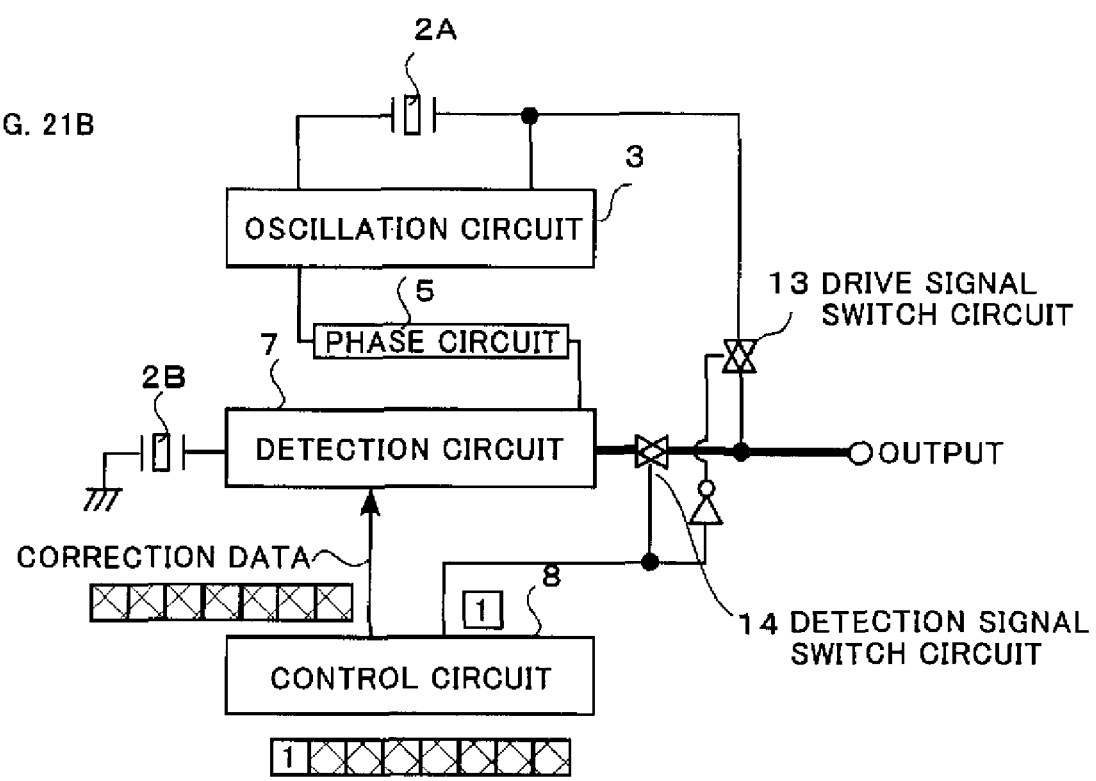

In the gyroscope device shown in FIG. 21, FIG. 21A shows a state where a drive signal for measuring the equivalent serial resistance value of the piezoelectric element is output in the examination mode and FIG. 21B shows a state where an output signal is output in the normal drive mode.

In FIG. 21A, because the "0" of the examination control bit in the sensitivity correction data is set, the drive signal switch circuit 13 is set to the ON state and the detection signal switch circuit 14 is set to the OFF state. As a result, a drive signal that drives the piezoelectric element is output by the output terminal 22.

However, in FIG. 21B, because the "1" of the examination control bit in the sensitivity correction data is set, the drive signal switch circuit 13 is set to the OFF state and detection signal switch circuit 14 is set to the ON state. As a result, the output signal from the detection circuit is output from the output terminal 22.

Figure 22:
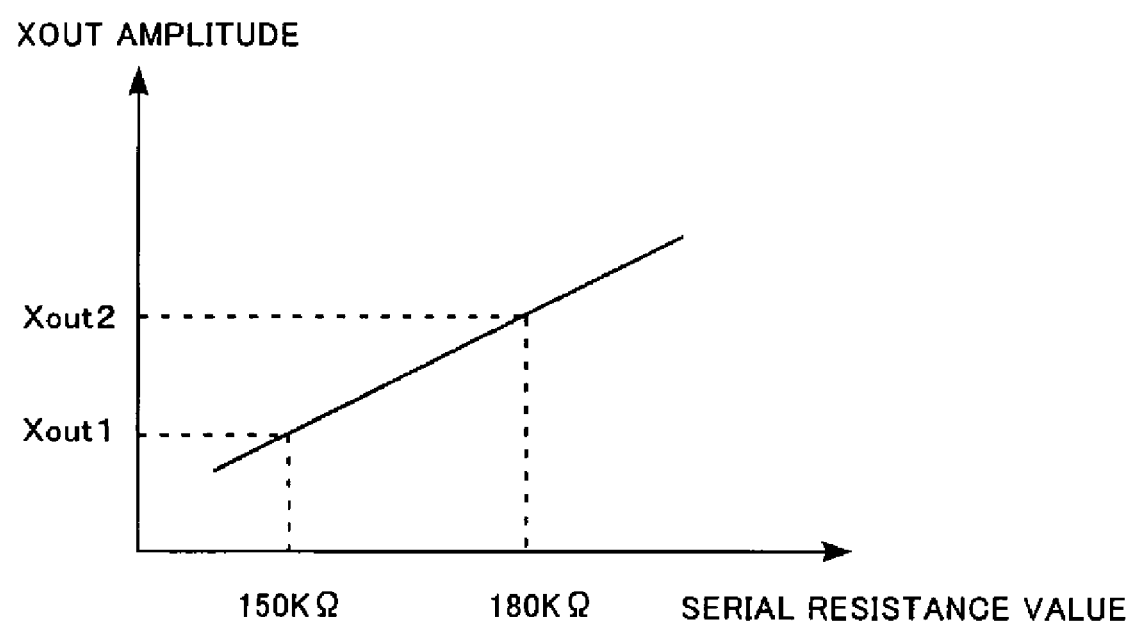
FIG. 22 shows the relationship between the equivalent serial resistance value of the piezoelectric element and the amplitude of the drive signal of the oscillation device or gyroscope device.

FIG. 22 shows the relationship between the equivalent serial resistance value of the piezoelectric element and the amplitude of the output signal of the oscillation device or gyroscope device. There is a predetermined relationship between the equivalent serial resistance value of the piezoelectric element and the amplitude of the output signal. Although a linear relationship is shown here, the relationship is not necessarily linear.

Even when a piezoelectric element of the same specification exists, the characteristic thereof (the equivalent serial resistance value) is not necessarily the same and includes inconsistencies. The inconsistencies in the equivalent serial resistance value of the piezoelectric element are expressed as inconsistencies in the amplitude of the output signal. In the case of the oscillation device and gyroscope device of the same specification, the inconsistencies in the amplitude of the output signal desirably lie within a range of a predetermined width.

The judgment of whether the amplitude of the output signal is favorable or not, as well as the adjustment of the amplitude, can be carried out by determining the equivalent serial resistance value in a predetermined relationship with the amplitude instead of determining the amplitude itself. In FIG. 14, for example, a range in which the equivalent serial resistance value is from 150 kO to 180 kO and the desirable range for the amplitude of the output signal are associated.

Figure 23A:
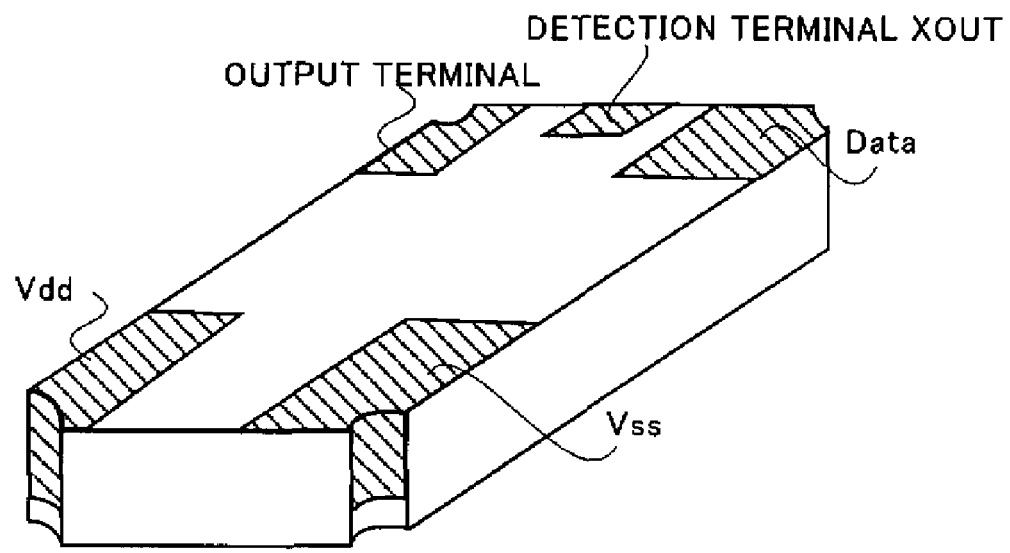
FIG. 23 shows an example of the disposition of the electrodes provided in the package as the terminals of the oscillation device.

FIG. 23 shows an example the disposition of electrodes that are provided in a package as terminals of the oscillation device. FIG. 23A shows a constitution that corresponds to the constitution in FIG. 1A and in which the output terminal and detection terminal are provided by other electrodes.

Figure 23B:
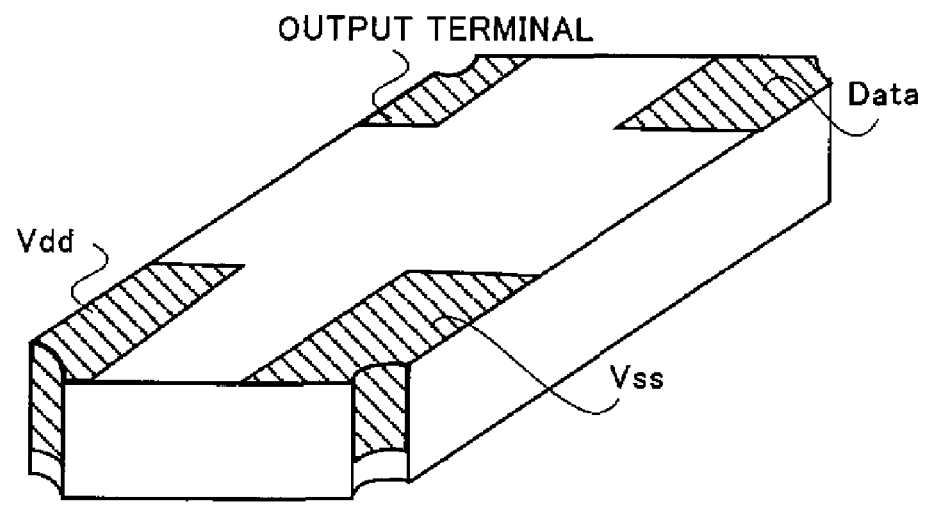
Figure 24:
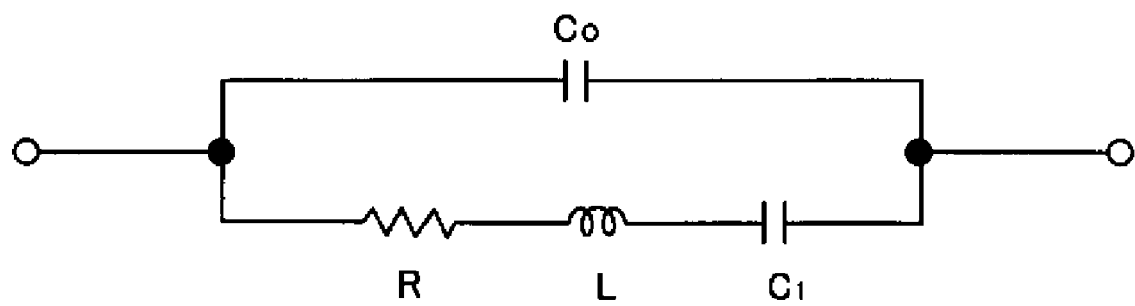
FIG. 24 shows a piezoelectric element equivalence circuit.
Figure 25A:
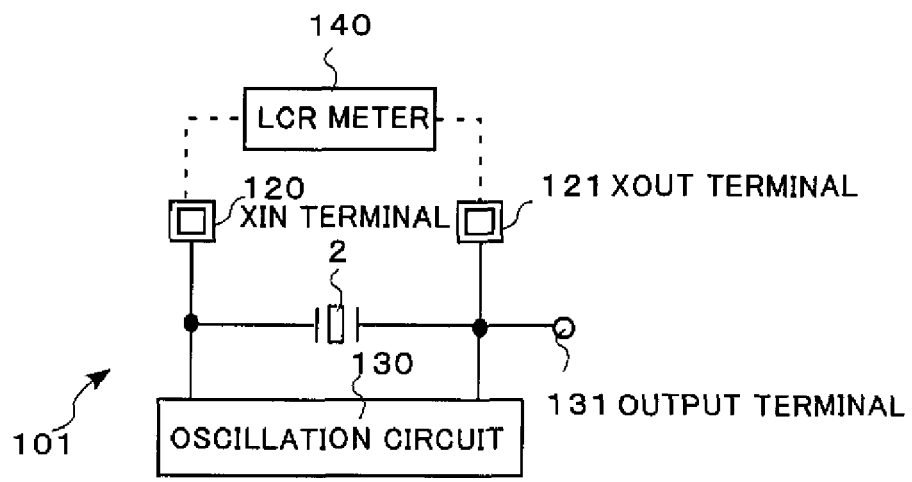
FIG. 25 is an example for connecting a conventional constitution which determines the serial resistance value of the piezoelectric element.
Figure 25B:
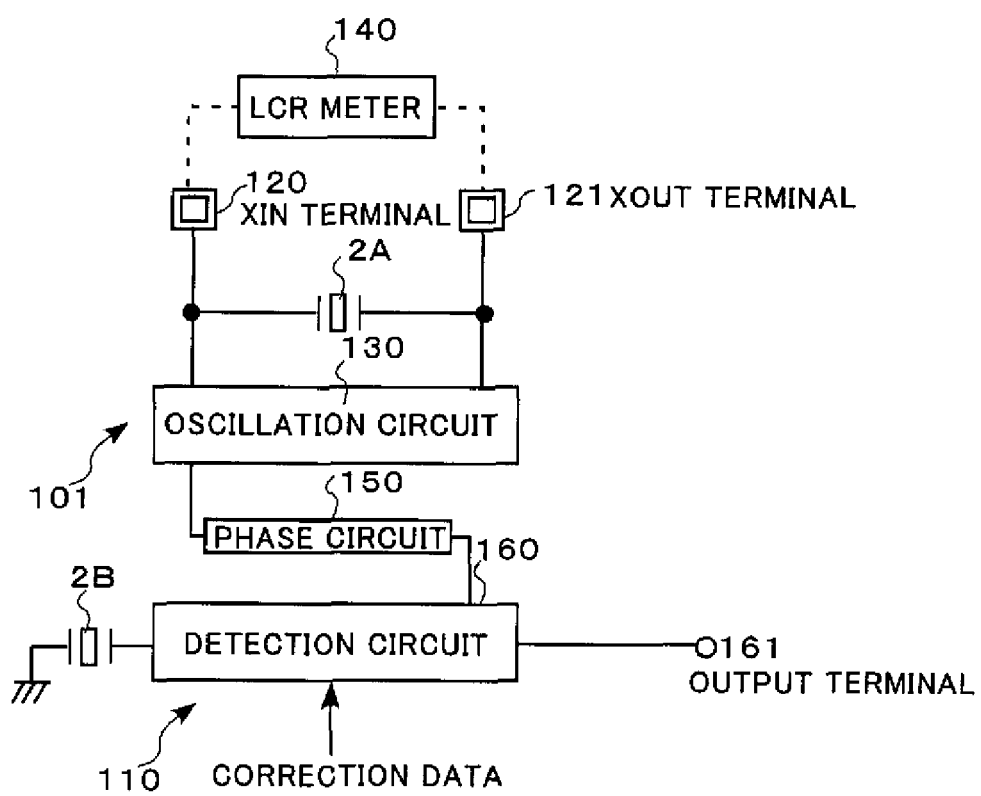
Figure 26:
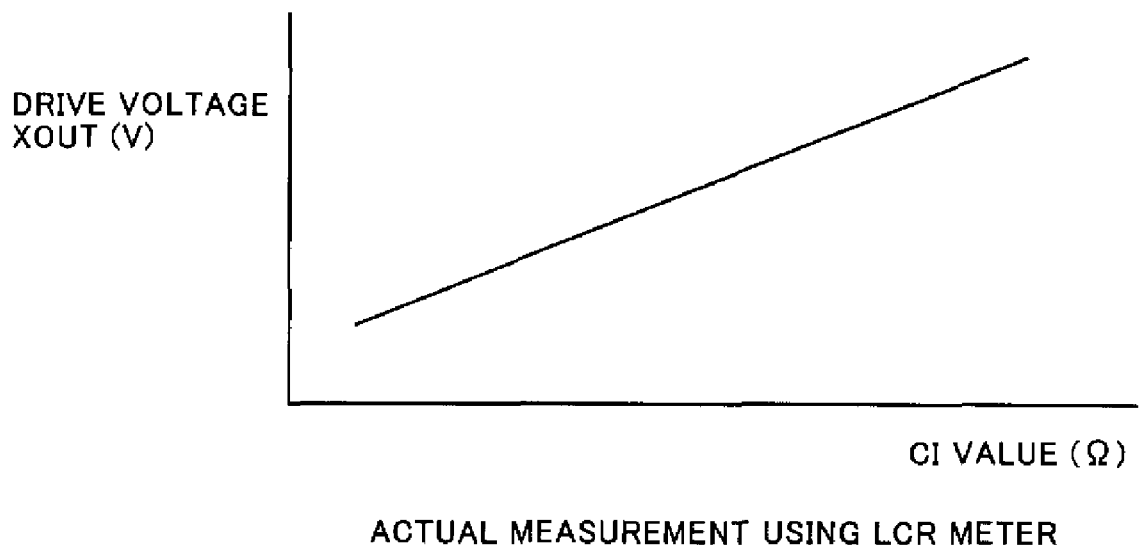
FIG. 26 shows the relationship between the serial resistance value (CI value) that is actually measured by the LCR meter and the drive voltage (Xout) of the oscillation circuit.

FIG. 23B shows a constitution in which the output terminal and detection terminal are provided by the same electrodes and which corresponds to the constitution of FIG. 1C above.

The present invention can be applied to an oscillation device that outputs a signal of a predetermined frequency and a gyroscope device that measures the angular velocity.

What is claimed is:

1. An oscillation device, comprising:
   a piezoelectric element having a drive terminal;
   an oscillation circuit that generates a drive signal for oscillation driving of the piezoelectric element, the drive signal being supplied to the piezoelectric element through feedback of the drive signal to the drive terminal of the piezoelectric element;
   a detection terminal;
   a drive signal switch circuit connected between the detection terminal and a closed circuit formed by the piezoelectric element and the oscillation circuit, wherein the drive signal generated by the oscillation circuit flows through the closed circuit and the drive signal switch circuit outputs the drive signal that flows through the closed circuit to the detection terminal when the drive signal switch circuit is closed.

2. The oscillation device according to claim 1, further comprising an oscillation output signal switch circuit that controls the external output of the output signal of the oscillation circuit and operates exclusively with respect to the drive signal switch circuit.

3. The oscillation device according to claim 1, wherein the drive signal switch circuit comprises: a first switch circuit that controls an electrical connection between the oscillation circuit and a detection terminal; and a second switch circuit that controls an electrical connection between a standing potential and a detection terminal, wherein the first switch circuit and the second switch circuit operate exclusively.

4. The oscillation device according to claim 1, wherein the oscillation circuit performs constant current control of the piezoelectric element; and
   the drive signal switch circuit outputs the drive voltage of the drive signal as a signal for calculating the equivalent serial resistance value of the piezoelectric element.

5. The oscillation device according to claim 1, wherein the oscillation circuit performs constant voltage control of the piezoelectric element; and
   the drive signal switch circuit outputs the drive current of the drive signal as a signal for calculating the equivalent serial resistance value of the piezoelectric element.

6. The oscillation device according to claim 1, wherein the drive signal switch circuit is constituted by a CMOS transistor.

7. The oscillation device according to claim 1, comprising:
   a detection circuit that detects an output that is output by the detection terminal of the piezoelectric element serving as the detection element, and outputs a detection signal; and
   a detection signal switch circuit that controls the external output of the detection signal of the detection circuit.

8. The oscillation device according to claim 7, wherein the drive signal switch circuit and detection signal switch circuit are exclusively controlled in conjunction with one another and either one of the drive signal and the detection signal is output to the outside.

9. The oscillation device according to claim 1, wherein the oscillation circuit performs constant voltage control or constant current control of the piezoelectric element; and
   the drive signal switch circuit outputs the drive current or drive voltage of the drive signal of the oscillation circuit as a signal for calculating the equivalent serial resistance value.

10. The oscillation device according to claim 7, further comprising:
    a control circuit that controls an amplification factor of an amplifier circuit of the detection circuit; and
    a storage circuit that stores correction data for adjusting the amplification factor,
    wherein the control circuit reads the correction data from the storage circuit during adjustment and adjusts the amplification factor on the basis of the correction data thus read.

11. The oscillation device according to claim 10, wherein the storage circuit stores control data for exclusively driving the drive signal switch circuit and detection signal switch circuit; and
    the control circuit reads the control data from the storage circuit and outputs either one of the drive signal and the detection signal to the outside.

12. The oscillation device according to claim 10, wherein the storage circuit stores the control data for exclusively driving the drive signal switch circuit and the detection signal switch circuit in an excess bit of the correction data for adjusting the amplification factor.

13. The oscillation device according to claim 7, wherein the oscillation circuit comprises:
    a current/voltage conversion circuit that converts the output current that is output by the piezoelectric element serving as the driven element into an AC voltage;
    a variable gain amplifier that amplifies an AC signal from the current/voltage conversion circuit and is able to vary an amplification factor;
    a rectification circuit that rectifies the output voltage from the current/voltage conversion circuit or the drive voltage applied to the piezoelectric element; and
    a comparison circuit that compares the output signal output from the rectification circuit and a predetermined reference signal and outputs a control voltage in accordance with fluctuations in the signal output from the rectification circuit,
    wherein the variable gain amplifier controls the amplification factor on the basis of the control voltage and maintains the output current from the piezoelectric element or the drive voltage applied to the piezoelectric element at a constant level.

14. The oscillation device according to claim 7, wherein the drive signal switch circuit and detection signal switch circuit are constituted by a CMOS transistor.

* * * * *